United States Patent
Jogan et al.

(10) Patent No.: US 10,193,010 B2
(45) Date of Patent: Jan. 29, 2019

(54) LIGHT EMITTING ELEMENT

(71) Applicant: FUJI XEROX CO., LTD., Tokyo (JP)

(72) Inventors: Naoki Jogan, Kanagawa (JP); Jun Sakurai, Kanagawa (JP); Akemi Murakami, Kanagawa (JP); Takashi Kondo, Kanagawa (JP); Junichiro Hayakawa, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 0 days.

(21) Appl. No.: 15/581,686

(22) Filed: Apr. 28, 2017

(65) Prior Publication Data

US 2018/0019362 A1    Jan. 18, 2018

(30) Foreign Application Priority Data

Jul. 12, 2016    (JP) .................................. 2016-137342

(51) Int. Cl.
*H01L 31/153*    (2006.01)
*H01L 31/0224*    (2006.01)
(Continued)

(52) U.S. Cl.
CPC ............ *H01L 31/153* (2013.01); *H01L 27/15* (2013.01); *H01L 31/022408* (2013.01); *H01L 31/022416* (2013.01); *H01L 31/03529* (2013.01); *H01L 31/035209* (2013.01); *H01L 31/035236* (2013.01); *H01L 33/06* (2013.01);
(Continued)

(58) Field of Classification Search
CPC .................. H01L 31/153; H01L 27/15; H01L 31/022416; H01L 31/035236; H01L 33/24; H01L 31/03529; H01L 31/035209; H01L 33/06; H01L 31/022408; H01L 33/145; H01L 33/38; H01S 5/18313; H01S 5/0265; H01S 5/18347; H01S 5/0683; H01S 5/1835; H01S 5/0425; H01S 5/0207
See application file for complete search history.

(56) References Cited

U.S. PATENT DOCUMENTS 5,283,447 A * 2/1994 Olbright ................. H01L 27/15
  257/197
5,404,373 A * 4/1995 Cheng ....................... G06E 1/04
  257/E31.102
(Continued)

FOREIGN PATENT DOCUMENTS

JP    2000-106471 A    4/2000
JP    2007-059770 A    3/2007
(Continued)

*Primary Examiner* — Su C Kim
(74) *Attorney, Agent, or Firm* — Sughrue Mion, PLLC

(57) ABSTRACT

A light emitting element includes:
a light emitting part that is formed on a front surface side of a semi-insulating substrate; and
a light receiving part that is formed on the front surface side, that shares a semiconductor layer with the light emitting part, and that receives light propagating in a lateral direction through the semiconductor layer from the light emitting part, wherein
anode electrodes and cathode electrodes of the light emitting part and the light receiving part are formed on the front surface side in a state in which the anode electrodes are separated from each other and the cathode electrodes are separated from each other.

20 Claims, 13 Drawing Sheets

(51) Int. Cl.
| | |
|---|---|
| *H01L 31/0352* | (2006.01) |
| *H01L 33/06* | (2010.01) |
| *H01L 33/24* | (2010.01) |
| *H01L 27/15* | (2006.01) |
| *H01S 5/026* | (2006.01) |
| *H01S 5/183* | (2006.01) |
| *H01L 33/14* | (2010.01) |
| *H01L 33/38* | (2010.01) |
| *H01S 5/02* | (2006.01) |
| *H01S 5/042* | (2006.01) |
| *H01S 5/0683* | (2006.01) |

(52) U.S. Cl.
CPC ............ *H01L 33/24* (2013.01); *H01S 5/0265* (2013.01); *H01S 5/18313* (2013.01); *H01L 33/145* (2013.01); *H01L 33/38* (2013.01); *H01S 5/0207* (2013.01); *H01S 5/0425* (2013.01); *H01S 5/0683* (2013.01); *H01S 5/1835* (2013.01); *H01S 5/18347* (2013.01)

(56) References Cited

U.S. PATENT DOCUMENTS

| | | | | |
|---|---|---|---|---|
| 5,748,661 | A * | 5/1998 | Kiely | H01S 5/0264 372/50.1 |
| 6,001,664 | A * | 12/1999 | Swirhun | H01S 5/0262 148/DIG. 128 |
| 9,054,232 | B2 * | 6/2015 | Chung | H01L 27/0694 |
| 2002/0130329 | A1 * | 9/2002 | Furukawa | G02B 6/12004 257/98 |
| 2008/0240196 | A1 | 10/2008 | Nishida | |

FOREIGN PATENT DOCUMENTS

| | | |
|---|---|---|
| JP | 2007-105328 A | 4/2007 |
| JP | 2008-277780 A | 11/2008 |

* cited by examiner

LIGHT EMITTING ELEMENT

CROSS-REFERENCE TO RELATED APPLICATIONS

This application is based on and claims priority under 35 USC 119 from Japanese Patent Application No. 2016-137342 filed Jul. 12, 2016.

BACKGROUND

Technical Field

The present invention relates to a light emitting element.

SUMMARY

According to an aspect of the invention, a light emitting element includes:
a light emitting part that is formed on a front surface side of a semi-insulating substrate; and
a light receiving part that is formed on the front surface side, that shares a semiconductor layer with the light emitting part, and that receives light propagating in a lateral direction through the semiconductor layer from the light emitting part, wherein
anode electrodes and cathode electrodes of the light emitting part and the light receiving part are formed on the front surface side in a state in which the anode electrodes are separated from each other and the cathode electrodes are separated from each other.

BRIEF DESCRIPTION OF THE DRAWINGS

Exemplary embodiments of the present invention will be described in detail based on the following figures, wherein.

DETAILED DESCRIPTION

Hereinafter, exemplary embodiments of the present invention will be described in detail with reference to the drawings. A light emitting element according to the present exemplary embodiment is a monitor PD integrated light emitting element in which a monitor photodiode (hereinafter, referred to as a "monitor PD") is integrated to receive a part of an optical output from a light emitting part.

[First Exemplary Embodiment]

Figure 1A:
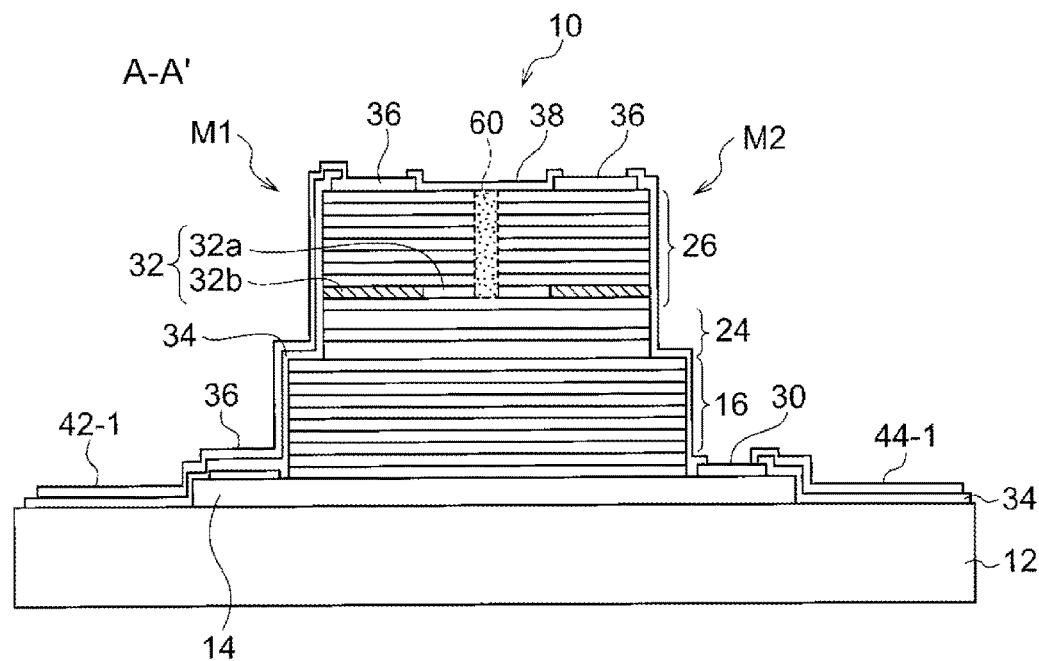
FIGS. 1A and 1B are a cross-sectional view and a top plan view illustrating an exemplary configuration of a light emitting element according to a first exemplary embodiment.
Figure 1B:
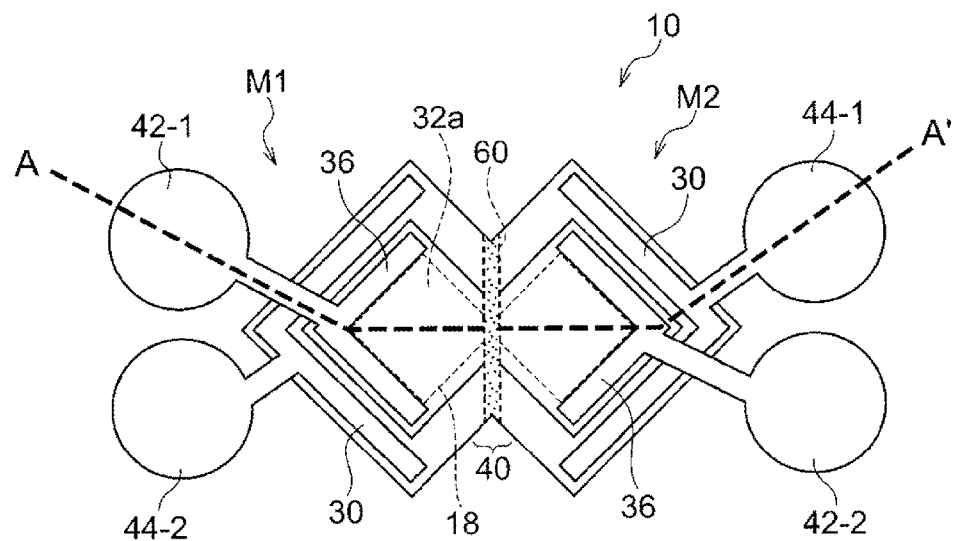

An exemplary configuration of a light emitting element 10 according to the present exemplary embodiment will be described with reference to FIGS. 1A and 1B. In the present exemplary embodiment, descriptions will be made while exemplifying an aspect in which a light emitting element according to the present invention is applied to a VCSEL (vertical cavity surface emitting laser). FIG. 1A is a cross-sectional view of a light emitting element 10 according to the present exemplary embodiment, and FIG. 1B is a top plan view of the light emitting element 10. The cross-sectional view illustrated in FIG. 1A is a cross-sectional view taken along line A-A' in the top plan view illustrated in FIG. 1B.

As illustrated in FIG. 1A, the light emitting element 10 includes an n-type GaAs contact layer 14, a lower DBR (distributed Bragg reflector) 16, an active region 24, an oxide confinement layer 32, and an upper DBR 26 which are formed on a semi-insulating GaAs (gallium arsenic) substrate 12.

As illustrated in FIG. 1B, the light emitting element 10 has two mesas (columnar structure), that is, a mesa M1 and a mesa M2 each having a substantially rectangular shape, and has a coupling portion 40 at a portion where the mesa M1 and the mesa M2 are connected to each other. The coupling portion 40 according to the present exemplary embodiment is provided at a narrow portion of a semiconductor layer which is formed as the mesa M1 and the mesa M2 are connected to each other. Each of the mesa M1 and the mesa M2 includes the lower DBR 16, the active region 24, the oxide confinement layer 32, and the upper DBR 26 which are formed in common on the contact layer 14.

In addition, a current blocking region 60, which is formed in the upper DBR 26, is disposed between the mesa M1 and the mesa M2, that is, in the coupling portion 40. A current blocking region 60 according to the present exemplary embodiment is a high resistance region which is formed from the upper surfaces of the mesas M1 and M2 to the oxide confinement layer 32 (i.e., to a depth that does not reach the active region 24) by, for example, implanting $H^+$(proton) ions. The current blocking region 60 electrically separates the mesa M1 and the mesa M2 from each other. As described below, in the light emitting element 10 according to the present exemplary embodiment, the mesa M1 constitutes a light emitting part (VCSEL), and the mesa M2 constitutes a light receiving part (monitor PD (photodiode)) that receives an optical output from the light emitting part. Hereinafter, the entire structure configured by the mesa M1 and the mesa M2 will be referred to as a mesa M.

The current blocking region 60 serves to improve the detection precision of the optical output (improve an signal to noise (S/N) ratio) by at least partially and electrically separating the light emitting part and the light receiving part from each other.

However, the current blocking region 60 is not essential. That is, the current blocking region 60 may not to be used depending on an acceptable degree for detecting precision.

As illustrated in FIG. 1A, an interlayer insulating film 34 as an inorganic insulating film is deposited on the circumference of the semiconductor layer including the mesa M. The interlayer insulating film 34 extends from a lateral surface of the mesa M to a surface of the substrate 12, and is disposed under a p-side electrode pad 42-1 and an n-side electrode pad 44-1. The interlayer insulating film 34 according to the present exemplary embodiment is formed of, for example, a silicon nitride film (SiN film). The material of the interlayer insulating film 34 is not limited to the silicon nitride film, but may be, for example, a silicon oxide film ($SiO_2$ film), a silicon oxynitride film (SiON film), or the like.

As illustrated in FIG. 1A, a p-side electrode wiring 36 is provided through an opening of the interlayer insulating film 34. A contact layer (not illustrated) is provided on the uppermost layer of the upper DBR 26 so as to be connected with the p-side electrode wiring 36, and one end side of the p-side electrode wiring 36 is connected to the upper DBR 26 through the contact layer so that an ohmic contact is formed between the p-side electrode wiring 36 and the upper DBR 26. The other end side of the p-side electrode wiring 36 extends from the lateral surface of the mesa M to the surface of the substrate 12, and constitutes the p-side electrode pad 42-1. The p-side electrode wiring 36 is formed by, for example, depositing a stacked film of Ti (titanium)/Au (gold). Hereinafter, the p-side electrode pad 42-1 and a p-side electrode pad 42-2 (see FIG. 1B) will be collectively referred to as a "p-side electrode pad 42." In the light emitting element 10, a p-side electrode constitutes an anode electrode.

Similarly, an n-side electrode wiring 30 is provided through an opening of the interlayer insulating film 34. One end side of the n-side electrode wiring 30 is connected to the contact layer 14 so that an ohmic contact is formed between the n-side electrode wiring 30 and the contact layer 14. Meanwhile, the other end side of the n-side electrode wiring 30 extends to the surface of the substrate 12, and forms the n-side electrode pad 44-1 as illustrated in FIG. 1A. The n-side electrode wiring 30 is formed by, for example, depositing a stacked film of AuGe/Ni/Au. Hereinafter, the n-side electrode pad 44-1 and an n-side electrode pad 44-2 (see FIG. 1B) will be collectively referred to as an "n-side electrode pad 44." In the light emitting element 10, an n-side electrode constitutes a cathode electrode.

As described above, for example, a semi-insulating GaAs substrate is used as the substrate 12 according to the present exemplary embodiment. The semi-insulating GaAs substrate refers to a GaAs substrate which is not doped with impurity. The semi-insulating GaAs substrate has very high resistivity, and a sheet resistance value thereof is about several megohms ($M\Omega$).

The contact layer 14 formed on the substrate 12 is formed by, for example, a GaAs layer that is doped with Si. One end of the contact layer 14 is connected to the n-type lower DBR 16, and the other end of the contact layer 14 is connected to the n-side electrode wiring 30. That is, the contact layer 14 is interposed between the lower DBR 16 and the n-side electrode wiring 30, and serves to provide a constant electric potential to the semiconductor layer including the mesa M. The contact layer 14 may also serve as a buffer layer provided to improve the crystallinity of the surface of the substrate after thermal cleaning.

Assuming that an oscillation wavelength of the light emitting element 10 is $\lambda$ and a refractive index of a medium (semiconductor layer) is n, the n-type lower DBR 16 formed on the contact layer 14 is a multilayer reflection mirror configured by repeatedly and alternately stacking two semiconductor layers each of which has a film thickness of 0.25 $\lambda/n$. The two semiconductor layers have different refractive indexes. Specifically, the lower DBR 16 is configured by repeatedly and alternately stacking an n-type low refractive index layer made of $Al_{0.90}Ga_{0.1}As$ and an n-type high refractive index layer made of $Al_{0.15}Ga_{0.85}As$. In the light emitting element 10 according to the present exemplary embodiment, the oscillation wavelength $\lambda$ is, for example, 850 nm.

The active region 24 according to the present exemplary embodiment may include, for example, a lower spacer layer, a quantum well active layer, and an upper spacer layer (not illustrated). The quantum well active layer according to the present exemplary embodiment may include, for example, four barrier layers made of $Al_{0.3}Ga_{0.7}As$ and three quantum well layers made of GaAs and provided between the barrier layers. In addition, by being disposed between the quantum well active layer and the lower DBR 16 and between the quantum well active layer and the upper DBR 26, respectively, the lower spacer layer and the upper spacer layer also serve to adjust the length of a resonator, and serve as clad layers for confining a carrier. In the light emitting element 10, since the mesa M1 constitutes the VCSEL, the active region 24 in the mesa M1 constitutes a light emitting layer, and the mesa M2 constitutes the monitor PD, the active region 24 in the mesa M2 substantially serves as a light absorbing layer.

The p-type oxide confinement layer 32 provided on the active region 24 is a current confinement layer, and includes a non-oxidized region 32a and an oxidized region 32b. The current, which flows from the p-side electrode pad 42-1 to the n-side electrode pad 44-2, is throttled by the non-oxidized region 32a. A boundary 18 illustrated in FIG. 1B represents a boundary between the non-oxidized region 32a and the oxidized region 32b. As illustrated in FIG. 1B, the non-oxidized region 32a according to the present exemplary embodiment, which is defined by the boundary 18, has a narrow shape in the coupling portion 40.

The upper DBR 26 formed on the oxide confinement layer 32 is a multilayer reflection mirror configured by repeatedly and alternately stacking two semiconductor layers each of which has a film thickness of 0.25 $\lambda/n$. The two semiconductor layers have different refractive indexes. Specifically, the upper DBR 26 is configured by repeatedly and alternately stacking a p-type low refractive index layer of $Al_{0.90}Ga_{0.1}As$ and a p-type high refractive index layer of $Al_{0.15}Ga_{0.85}As$.

An emission surface protective layer 38 is provided on the upper DBR 26 to protect a light emission surface. For example, the emission surface protective layer 38 is formed by depositing a silicon nitride film.

By the way, the light emitting element (VCSEL) takes out a laser output in a direction perpendicular to the substrate, and is easily configured as an array by 2-dimensional integration, and thus the light emitting element (VCSEL) is used as a writing light source for an electrophotographic system or a light source for optical communication.

The VCSEL includes a pair of distributed Bragg reflectors (the lower DBR 16 and the upper DBR 26) provided on the semiconductor substrate (substrate 12), and an active region (the active region 24 including the active layer, the lower spacer layer, and the upper spacer layer) provided between the pair of distributed Bragg reflectors. The light emitting device is configured such that a current is applied to the active layer by the electrodes (the p-side electrode wiring 36 and the n-side electrode wiring 30) provided at the opposite sides of the distributed Bragg reflector, and laser oscillation occurs in a direction perpendicular to the surface of the substrate such that the oscillated light is emitted from the upper portion of an element (the surface side of the emission surface protective layer 38).

Meanwhile, the semiconductor laser (not limited to the VCSEL) is required to be stabilized in some cases so that the optical output is not changed in accompany with a change in temperature or a change in power source. As a method for the stabilization, there is an automatic power control (APC) method. The APC method refers to a method of detecting an optical output of the semiconductor laser as a monitor current by using the monitor PD and the like, obtaining a difference value by comparing the detected monitor current with a reference value, and performing a negative feedback control on the optical output of the semiconductor laser by converting a driving current by using the differential value.

Due to the reason that the semiconductor laser and the monitor PD are made of different semiconductor materials, it is difficult to implement a monolithic integration in many cases. In this case, the monitor PD is provided outside the semiconductor laser. Accordingly, if the semiconductor laser and the monitor PD are capable of being integrated with each other in a monolithic manner, the number of components may be reduced. Further, it is also desirable in terms of a stable operation since noise or the like may hardly affect the semiconductor laser and the monitor PD.

As an example of the VCSEL in the related art in which the monitor PD is integrated in a monolithic manner, there is known a VCSEL in which a mesa-shaped light emitting part is surrounded by a high resistance region and a monitor photodiode having the same layer structure as the light emitting part is disposed around the high resistance region, so that the lower portion of the light intensity distribution of the light emitting part reaches a light absorbing part of the monitor photodiode.

Meanwhile, since bias voltages applied to the PD and the semiconductor laser have different polarities, it is necessary to individually apply electric power to the VCSEL and the monitor PD formed on the same chip in the semiconductor laser (VCSEL) integrated with the monitor PD. In the related art, since one electrode is typically provided on a back surface (back electrode) of the chip in the VCSEL, the back electrode becomes a common electrode for the VCSEL and the monitor PD even in the monitor PD integrated VCSEL. Even in the VCSEL in the related art, the light emitting part and the monitor photodiode use the common back electrode.

However, in the monitor PD integrated VCSEL having a configuration in which the common electrode is used for the VCSEL and the monitor PD, particularly, in a case where a differential driving method is used as a driving method for the VCSEL, electrical crosstalk occurs at the common electrode or around the common electrode, and as a result, an inadvertent signal leaks to the monitor PD in some cases. When crosstalk occurs at the monitor PD, an S/N ratio of a monitor current deteriorates and an accurate APC control becomes difficult to implement.

Therefore, in the light emitting element 10 according to the present exemplary embodiment, the common electrode is not used, an electrode of the light emitting part and an electrode of the light receiving part are separated from each other, and both the electrodes are formed on a front surface side of the substrate 12. Therefore, particularly in a case where the VCSEL is differentially driven at a high speed, electrical crosstalk between the light emitting part and the light receiving part is reduced, compared with a configuration having a common electrode on the back surface.

Next, a configuration of the light emitting element 10 according to the present exemplary embodiment will be described in more detail. In many cases, the VCSEL is provided with an oxide confinement layer (oxide confinement layer 32) formed by oxidizing a semiconductor layer including Al in the composition thereof from the point of view of reducing a threshold current value and controllability in a transverse mode, and the element is etched in a mesa shape and subjected to an oxidation treatment in order to oxidize the semiconductor layer including Al. Thereafter, a lateral surface having the mesa shape which is exposed by etching processing or the etched surface of the semiconductor is generally covered with an insulating material such as a silicon nitride film or a silicon oxide film.

In the light emitting element 10, a non-oxidized region 32*a* and an oxidized region 32*b* are formed by the oxidation treatment on the mesa M. The boundary 18 illustrated in FIG. 1B is a boundary between the non-oxidized region 32*a* and the oxidized region 32*b*. That is, the non-oxidized region 32*a* defined by the boundary 18 is formed from the mesa M1 to the mesa M2.

Since the oxidized region 32*b* is oxidized to have a high electrical resistance, the oxidized region 32*b* serves as a non-conductive region, and the current introduced from a p-side electrode pad 42-1 is confined in the non-oxidized region 32*a*. In addition, when a semiconductor is oxidized, a refractive index of the semiconductor is generally decreased. Therefore, the refractive index of the non-oxidized region 32*a* becomes larger than a refractive index of the oxidized region 32*b*. For this reason, the light emitted from the light emitting part is confined in the non-oxidized region 32*a* surrounded by the oxidized region 32*b* having a low refractive index. That is, the light and current are confined in the non-oxidized region 32*a* by the oxide confinement layer.

In the light emitting element 10, since the non-oxidized region 32*a* is formed from the light emitting part configured with the mesa M1 to the light receiving part configured with the mesa M2, a part of laser oscillation light generated by the light emitting part is propagated in a direction parallel to the substrate 12 (i.e., a direction intersecting the oscillation direction of the light emitting part) (hereinafter, referred to as a "lateral direction" in some cases), reaches the light receiving part (monitor PD), and then is converted into a current.

As described above, in the light emitting element 10 according to the present exemplary embodiment, a coupling resonator is configured as the light emitting part configured with the mesa M1 and the light receiving part configured with the mesa M2 are optically coupling to each other, and light leaking from the light emitting part is propagated to the coupling portion 40, and detected as a monitor current by a detector connected to the light receiving part. That is, according to the light emitting element 10 of the present exemplary embodiment, a highly efficient monitor PD integrated light emitting element having a compact and simple device structure is implemented. Since the detector often detects the monitor current by converting the monitor current into a voltage, a current-voltage conversion unit will be described below while exemplifying the current-voltage conversion unit as an exemplary detector.

Figure 2A:
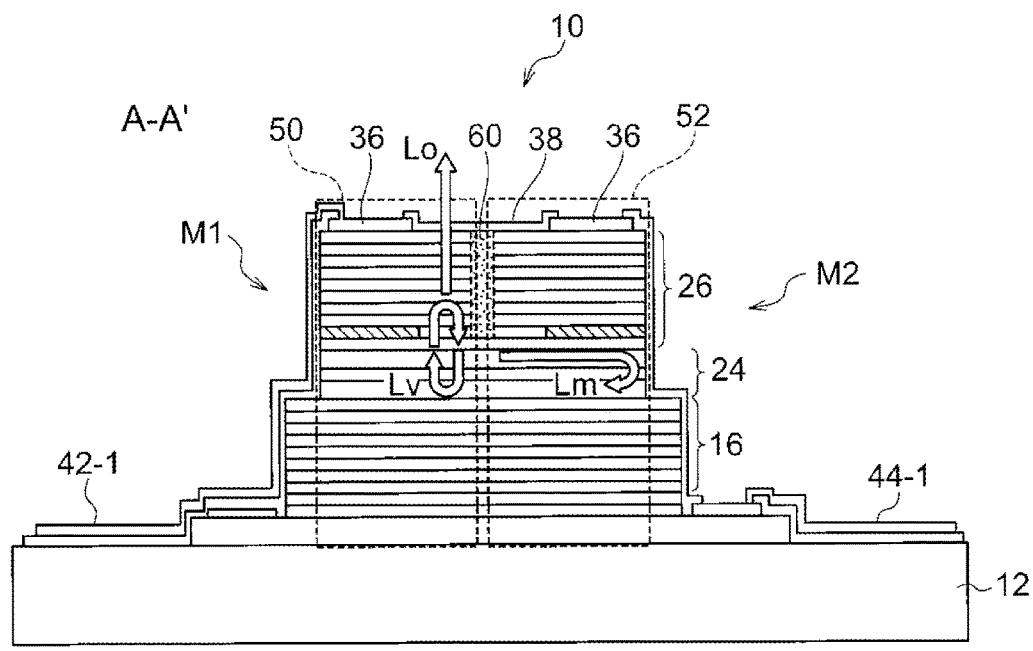
FIGS. 2A and 2B are views for explaining an operation of the light emitting element according to the exemplary embodiment.

The coupling resonator according to the present exemplary embodiment will be described in more detail with reference to FIG. 2. As described above, in the light emitting element 10, a light emitting part 50 (VCSEL) is formed by the mesa M1, and a light receiving part (monitor PD) 52 is formed by the mesa M2. In the light emitting part 50, a positive pole of a power source (not illustrated) for the VCSEL is connected to the p-side electrode pad 42-1, and a negative pole thereof is connected to an n-side electrode pad 44-2 (forward bias). As the driving current is applied between the p-side electrode pad 42-1 and the n-side electrode pad 44-2, oscillation light Lv is generated by the resonator formed by the lower DBR 16 and the upper DBR 26, as illustrated in FIG. 2. A part of the oscillation light Lv is emitted, as projection light Lo, from the emission surface protective layer 38.

As illustrated in FIG. 2, apart of the oscillation light Lv is propagated as propagating light Lm (monitor light) in the lateral direction. The propagating light Lm is propagated from the light emitting part 50 to the light receiving part 52 while being totally reflected by the resonator formed by the lower DBR 16 and the upper DBR 26. For this reason, a group velocity of the propagating light Lm is decreased, so that the propagating light Lm becomes so-called slow light. Meanwhile, in the light receiving part 52, a positive pole of a power source (not illustrated) for the monitor PD is connected to the n-side electrode pad 44-1, and a negative pole thereof is connected to the p-side electrode pad 42-2 (reverse bias). As a light receiving current generated by the propagating light Lm is applied between the n-side electrode pad 44-1 and the p-side electrode pad 42-2, the optical output from the light emitting part 50 is monitored. In this case, the light absorbing layer of the light receiving part 52 also serves as the active region 24 that constitutes the light emitting part. For this reason, the light absorbing layer, which constitutes the light receiving part 52, does not necessarily have a sufficient film thickness. However, since the monitor light according to the present exemplary embodiment is the slow light as described above, a carrier is easily generated and a sufficient photocurrent is obtained even in the case where the light absorbing layer is thin.

Figure 2B:
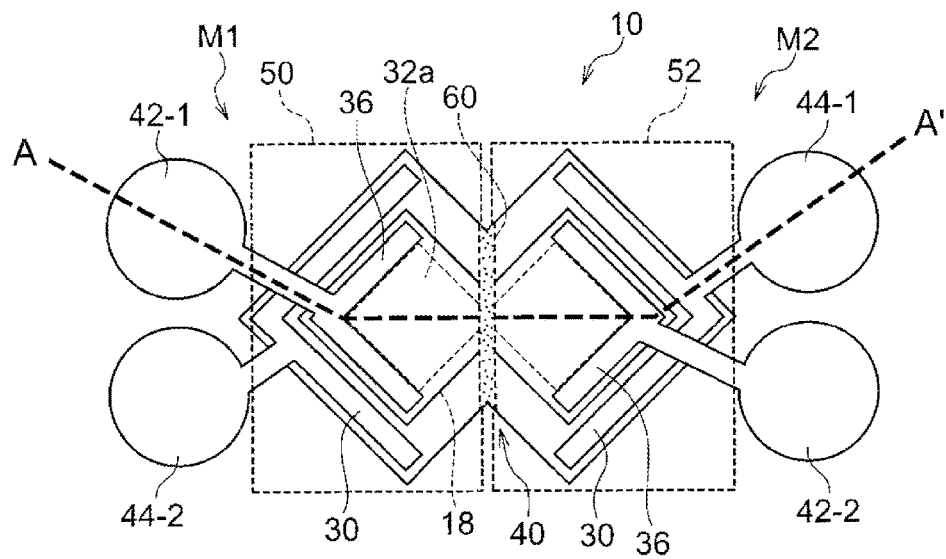

Next, an operation of the coupling portion 40 according to the present exemplary embodiment will be described. As illustrated in FIG. 2B, the non-oxidized region 32a and the oxidized region 32b are constricted in the coupling portion 40. For this reason, a width of the non-oxidized region 32a is set to be "wide," "narrow," and "wide" from the light emitting part 50 illustrated in FIG. 2B to the light receiving part 52.

Meanwhile, a ratio of an area of the oxidized region 32b to an area of the non-oxidized region 32a is set to be "small," "large," and then "small." Here, as described above, the refractive index of the non-oxidized region 32a is greater than that of the oxidized region 32b. As known in the related art, as a proportion of materials having a low refractive index is increased around a light waveguide, a refractive index sensed from light propagating through the light waveguide (equivalent refractive index, or effective refractive index) is decreased. For this reason, the equivalent refractive index of the non-oxidized region 32a in the coupling portion 40 is lower than the equivalent refractive index of the non-oxidized region 32a of the light emitting part 50 and the light receiving part 52 at both sides. That is, an equivalent refractive index of the non-oxidized region 32a is set to be "high," "low," "high" from the light emitting part 50 to the light receiving part 52. The equivalent refractive index used in the present exemplary embodiment refers to an index obtained by an equivalent refractive index method by using an effective refractive index (a refractive index of a multi-layered semiconductor layer is considered as a refractive index of a single layer) of semiconductor layers which are stacked in a direction perpendicular to the substrate and have different refractive indexes.

As the light emitting element 10 has an equivalent refractive index distribution of the aforementioned configuration, the light emitted from the light emitting part 50 (VCSEL) is effectively confined in the non-oxidized region 32a, and the light (slow light) leaks from the light emitting part 50 to be received by the light receiving part 52. In addition, in a case where the equivalent refractive index of the non-oxidized region 32a is set to be "high," "high," and then "high" from the light emitting part 50 to the light receiving part 52, that is, the equivalent refractive index of the non-oxidized region 32a is set to be substantially constant, it is difficult to confine the light in the light emitting part 50. Meanwhile, in a case where the equivalent refractive index of the non-oxidized region 32a is set to be "high," "low," and then "low" from the light emitting part 50 to the light receiving part 52, the light may be confined in the light emitting part 50, but the amount of leaking light is reduced, and for example, it is difficult to detect the monitor current, and the S/N ratio becomes worse.

In the present exemplary embodiment, descriptions have been made while exemplifying an aspect in which the equivalent refractive index is set to be "high," "low," and then "high" by narrowing the width of the non-oxidized region 32a in the coupling portion 40. It should be noted that the present invention is not limited thereto. For example, the equivalent refractive index may be set to be "high," "low," and then "high" by providing a groove at a position of the coupling portion 40 (between the light emitting part 50 and the light receiving part 52). A configuration in which the width is decreased and a configuration in which the groove is provided may be combined. In this case, the groove may be filled with a material (e.g., air) having a refractive index lower than that of the semiconductor layer around the groove.

Figure 3A:
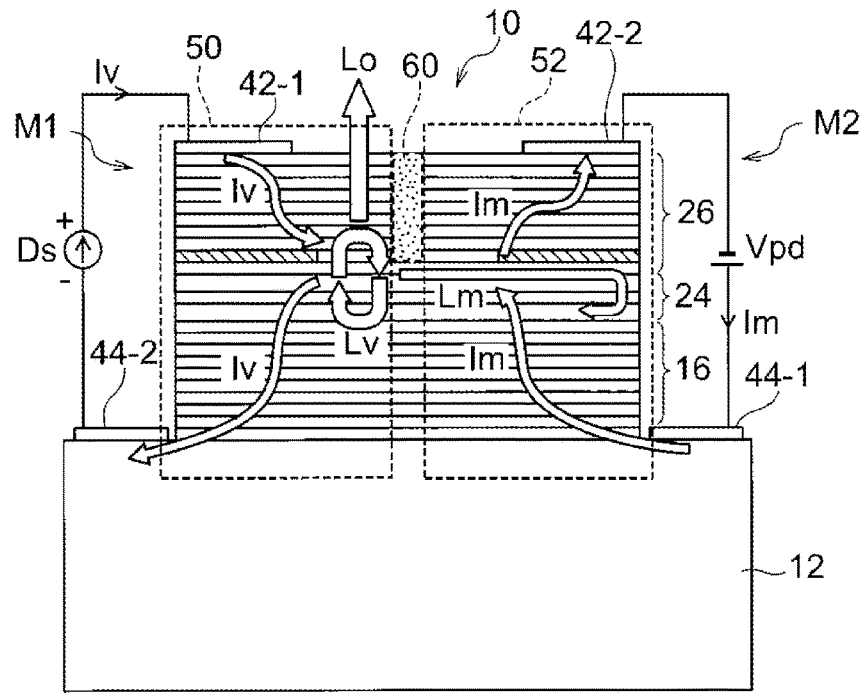
FIGS. 3A and 3B are views for explaining an electrode structure of the light emitting element according to the exemplary embodiment in comparison with an electrode structure of a light emitting element in the related art.
Figure 3B:
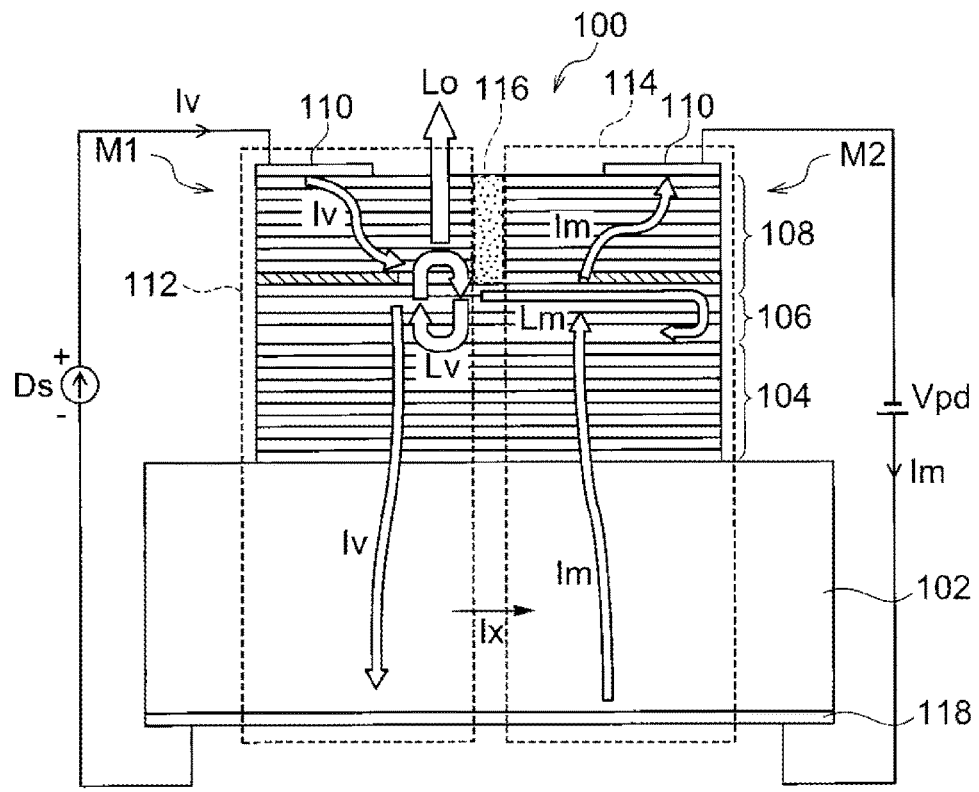

Next, an operation of the light emitting element 10 will be described with reference to FIGS. 3A and 3B. In FIG. 3A, the electrode is schematically illustrated for intuitive understanding of a flow of a current. That is, as illustrated in FIG. 3A, the p-side electrode pad 42-1 and the n-side electrode pad 44-2 are connected to the light emitting part 50, and the n-side electrode pad 44-1 and the p-side electrode pad 42-2 are connected to the light receiving part 52.

FIG. 3A illustrates a state in which a driving source Ds for driving the light emitting part 50 and a power source Vpd for biasing the light receiving part 52 are connected to the light emitting element 10 according to the present exemplary embodiment. FIG. 3B illustrates a state in which a driving source Ds for driving a light emitting part 112 and a power source Vpd for biasing a light receiving part 114 are connected to a back electrode type light emitting element 100 according to a comparative example which is illustrated to be compared with the light emitting element 10. FIGS. 3A and 3B illustrate states in which the driving source Ds differentially drives the light emitting parts 50 and 112 of the light emitting elements.

The light emitting element 100 according to the comparative example is identical to the light emitting element 10 except for the configuration which has a back electrode 118 instead of the n-side electrode pad 44 of the light emitting element 10. That is, as illustrated in FIG. 3B, the light emitting element 100 also includes an n-type GaAs contact layer (not illustrated), a lower DBR 104, an active region 106, and an upper DBR 108, which are formed on a semi-insulating GaAs substrate 102. The mesa M1 constitutes the light emitting part 112, the mesa M2 constitutes the light receiving part 114, and a current blocking region 116 is provided between the mesas M1 and M2.

In the light emitting element 100, when a driving current Iv is supplied to the light emitting part 112 from the driving source Ds through p-side electrode wiring 110 and the back electrode 118, oscillation light Lv is generated as described above, and a part of the oscillation light Lv is emitted to the outside as projection light Lo. Meanwhile, a part of the oscillation light Lv becomes propagating light Lm and is propagated to the light receiving part 114, so that a monitor current Im (light receiving current) is generated.

Here, in the VCSEL, while the thickness of a stacked portion (in FIG. 1A, a portion above the substrate 12 from the lower DBR 16 to the emission surface protective layer 38) is typically about 10 µm, the thickness of the substrate is thick, that is, several hundreds of micrometers (µm) for the purpose of securing strength and the like. For this reason, in the light emitting element 100, a path of the driving current Iv and a path of the monitor current Im easily overlap each other in a current path from the stacked portion to the back surface of the substrate, and thus crosstalk easily occurs. When crosstalk occurs, a crosstalk current Ix flows from the light emitting part 112 to the light receiving part 114 as illustrated in FIG. 3B. The crosstalk current Ix is a signal irrelevant to the monitor current Im and thus becomes noise, and hinders an optical output from being monitored by the light receiving part 114.

On the contrary, in the light emitting element 10, as illustrated in FIG. 3A, the n-side electrode pads 44-1 and 44-2 are provided instead of the back electrode 118, the p-side electrode pad 42-1 and the n-side electrode pad 44-2 are separated from each other in the light emitting part 50, and the p-side electrode pad 42-2 and the n-side electrode pad 44-1 are separated from each other in the light receiving part 52. In the light emitting part 50, the driving source Ds is connected between the p-side electrode pad 42-1 and the n-side electrode pad 44-2. Meanwhile, in the light receiving part 52, a positive pole of the power source Vpd is connected to the n-side electrode pad 44-1, and a negative pole of the power source Vpd is connected to the p-side electrode pad 42-2.

The light emitting part 50 is differentially driven by the driving source Ds, the oscillation light Lv is generated by the driving current Iv, and a part of the oscillation light Lv is output to the outside as the projection light Lo. Meanwhile, in the light receiving part 52 reversely biased by the power source Vpd, the monitor current Im is generated by the propagating light Lm, and an optical output Po in the light emitting part 50 is monitored by the monitor current Im.

In the light emitting element 10, the p-side electrode wiring 36 and the n-side electrode wiring 30 are separated from each other in the light emitting part 50, the p-side electrode wiring 36 and the n-side electrode wiring 30 are separated from each other in the light receiving part 52, and each wiring is disposed on a front surface side of the light emitting element 10. For this reason, since neither the driving current Iv nor the monitor current Im flows through the substrate 12 as illustrated in FIG. 3A, the occurrence of the crosstalk current is prevented.

Next, a relationship between the projection light Lo projected from the light emitting part 50 (VCSEL) and the monitor current Im will be described with reference to FIGS. 4A and 4B.

Figure 4A:
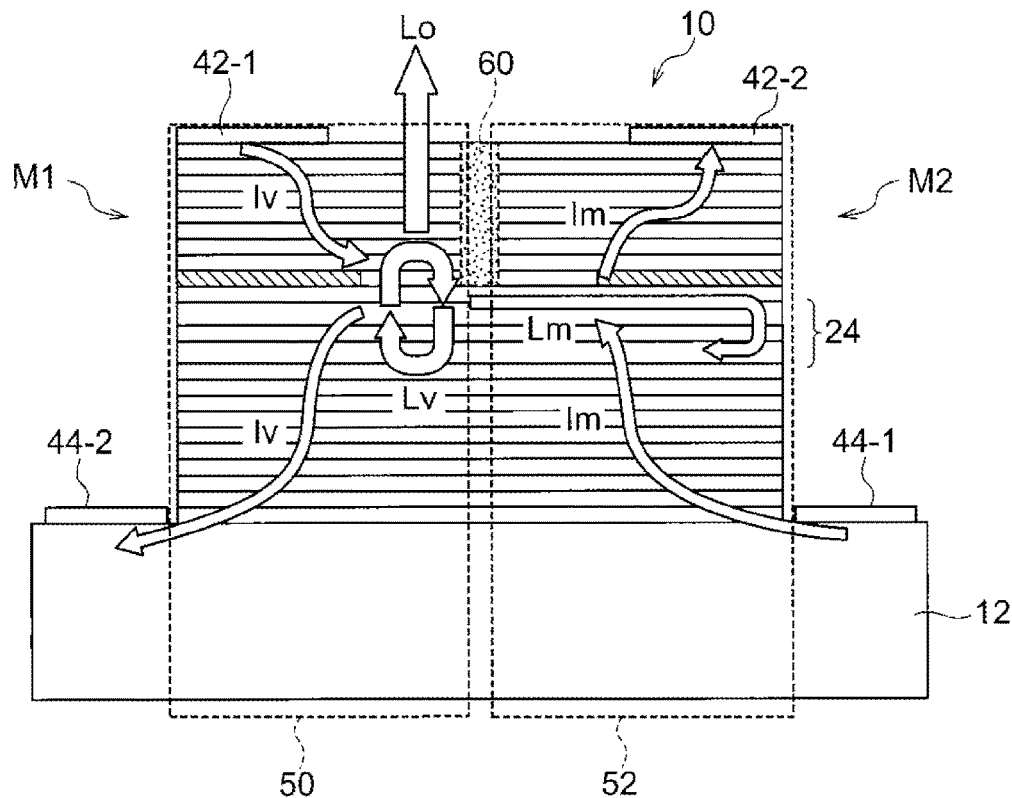
FIGS. 4A and 4B are views for explaining a relationship between an optical output and monitor current of the light emitting element according to the exemplary embodiment.

In the light emitting part 50, when one end of the driving source Ds is connected to the p-side electrode pad 42-1, the other end thereof is connected to the n-side electrode pad 44-2, and the driving current Iv flows (see FIG. 3A), the oscillation light Lv is generated by the resonator formed by the lower DBR 16 and the upper DBR 26, as illustrated in FIG. 4A. A part of the oscillation light Lv is projected as the projection light Lo from the light emitting surface (a surface on which the emission surface protective layer 38 is present). Meanwhile, a part of the oscillation light Lv is propagated in the lateral direction as the propagating light Lm, and enters the light receiving part 52. In the light receiving part 52, when the positive pole of the power source Vpd is connected to the n-side electrode pad 44-1, the negative pole thereof is connected to the p-side electrode pad 42-2, and the monitor current Im (photocurrent) flows by the propagating light Lm, the optical output from the light emitting part 50 is monitored. That is, the amount of leaking light of the propagating light Lm in the lateral direction is changed according to the optical output Po of the light emitting part 50 (VCSEL), and the value of the monitor current Im (photocurrent) is changed according to the change amount.

Figure 4B:
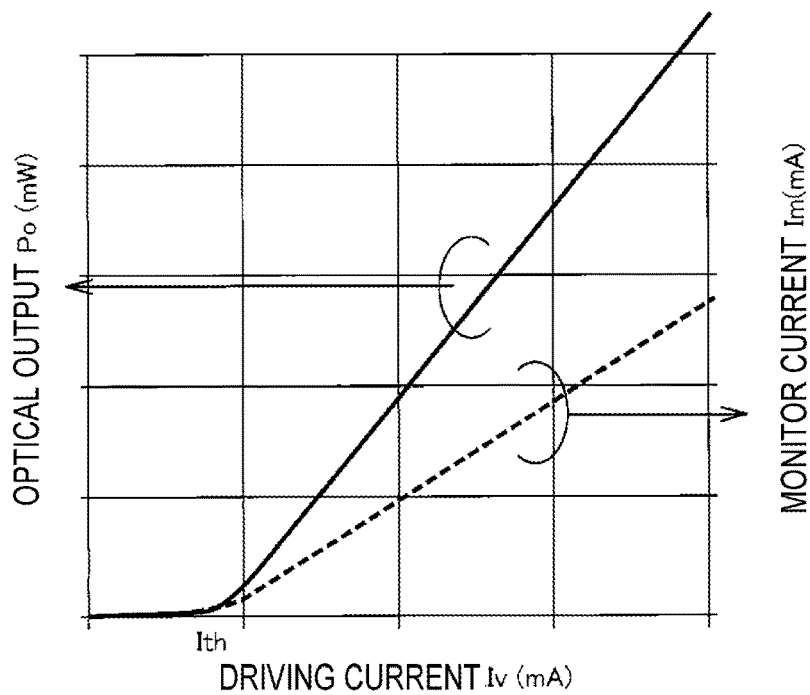

FIG. 4B is a graph illustrating a relationship among the driving current Iv, the optical output Po, which is light power of the projection light Lo, and the monitor current Im.

As illustrated in FIG. 4B, the light emitting part 50 (VCSEL) basically generates the optical output Po substantially proportional to the driving current Iv, but the light emitting part 50 has an inherent threshold value current (threshold current) Ith, and the optical output Po is generated when the driving current Iv exceeds the threshold value current Ith. Meanwhile, the monitor current Im is generated approximately in proportion to the optical output Po. Therefore, it is possible to monitor the optical output Po of the light emitting part 50 by using the monitor current Im.

Figure 5:
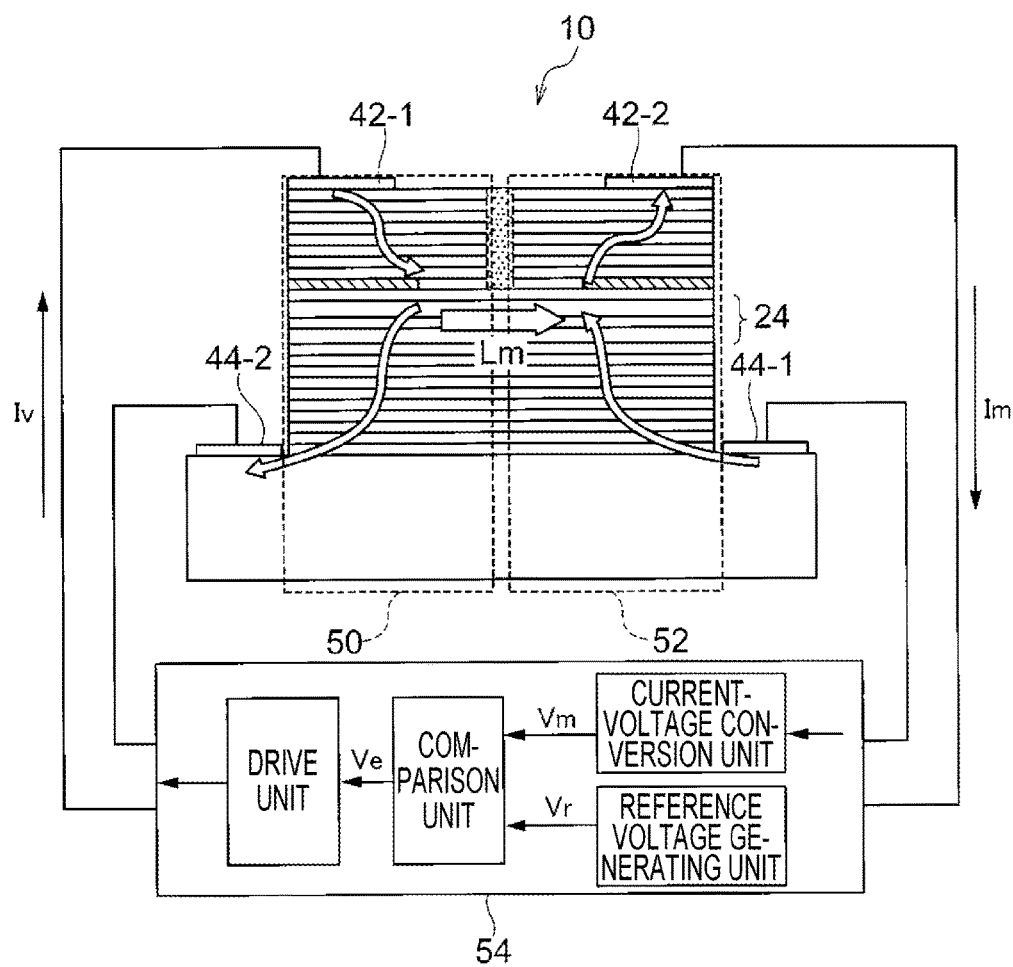
FIG. 5 is a view for explaining APC control of the light emitting element according to the exemplary embodiment.

Next, an APC controller 54 will be described with reference to FIG. 5. FIG. 5 illustrates the light emitting element 10 and the APC controller 54 connected to the light emitting element 10.

As illustrated in FIG. 5, the APC controller 54 includes a current-voltage conversion unit, a reference voltage generating unit, a comparison unit, and a drive unit. The current-voltage conversion unit inputs the monitor current Im generated by the light receiving part 52 of the light emitting element 10, and converts the monitor current Im into monitor voltage Vm. The monitor voltage Vm is also proportional to the optical output Po like the monitor current Im. The reference voltage generating unit is a part that generates a reference voltage Vr with respect to the monitor voltage Vm, and the reference voltage Vr determines a target value of the optical output Po. The current-voltage conversion unit is configured with, for example, a resistance that generates the monitor voltage Vm proportional to the monitor current Im when the monitor current Im is applied thereto. In that event, the monitor current Im may be an input, and the resistance may be a load by using a current mirror circuit that generates current proportional to the monitor current Im. In addition, the current-voltage conversion unit is not limited to these circuits. An amplifier circuit or the like may be provided as necessary.

The comparison unit is a part which compares the monitor voltage Vm and the reference voltage Vr and generates an error voltage Ve, and in an APC control, the error voltage Ve is controlled to be close zero. The drive unit is a part that generates the driving current Iv according to the error voltage Ve, and performs a negative feedback on the light emitting part 50 of the light emitting element 10. The driving current may be driving voltage.

In the light emitting element 10, the stabilization of the optical output Po is achieved by controlling the optical output Po of the light emitting part 50 by the APC controller 54 configured as described above.

Next, a method of manufacturing the light emitting element 10 according to the exemplary embodiment will be described with reference to FIGS. 6A to 6F and FIGS. 7A to 7D. In the present exemplary embodiment, plural light emitting elements 10 are formed on a single wafer. One of the light emitting elements 10 will be illustrated and described below.

Figure 6A:
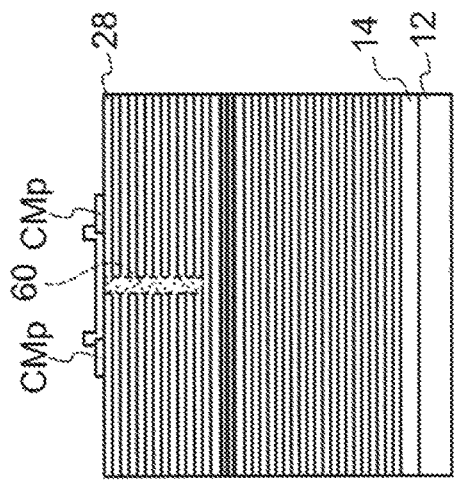
FIGS. 6A to 6F are a part of cross-sectional views illustrating an exemplary method of manufacturing the light emitting element according to the exemplary embodiment.

As illustrated in FIG. 6A, first, the n-type contact layer 14, the n-type lower DBR 16, the active region 24, the p-type upper DBR 26, and a p-type contact layer 28 are epitaxially grown in this order on the semi-insulating GaAs substrate 12.

In this regard, for example, the n-type contact layer 14 is formed by setting the carrier concentration to about $2 \times 10^{18}$ cm$^{-3}$ and the film thickness to about 2 µm. For example, the n-type lower DBR 16 is formed by alternately stacking an $Al_{0.15}Ga_{0.85}As$ layer and an $Al_{0.9}Ga_{0.1}As$ layer, each of which has a film thickness of ¼ of an in-medium wavelength λ/n, in 37.5 cycles. Each of the carrier concentration of the $Al_{0.3}Ga_{0.7}As$ layer and the carrier concentration of the $Al_{0.9}Ga_{0.1}As$ layer is about $2 \times 10^{18}$ cm$^{-3}$, and the overall film thickness of the lower DBR 16 is about 4 µm. For example, Si (silicon) is used as the n-type carrier.

The active region 24 includes a lower spacer layer configured as, for example, a non-doped $Al_{0.6}Ga_{0.4}As$ layer, a non-doped quantum well active layer, and an upper spacer layer configured as, for example, a non-doped $Al_{0.6}Ga_{0.4}As$ layer. For example, the quantum well active layer includes four barrier layers made of $Al_{0.3}Ga_{0.7}As$, and three quantum well layers which are provided among the respective barrier layers and made of GaAs. The film thickness of each of the barrier layers of $Al_{0.3}Ga_{0.7}As$ is about 8 nm, the film thickness of each of the quantum well layers of GaAs is about 8 nm, and the overall film thickness of the active region 24 becomes the in-medium wavelength λ/n.

The p-type upper DBR 26 is formed, for example, by alternately stacking an $Al_{0.15}Ga_{0.85}As$ layer and an $Al_{0.9}Ga_{0.1}As$ layer, each of which has a film thickness of ¼ of the in-medium wavelength λ/n, in 25 cycles. In this case, each of the carrier concentration of the $Al_{0.15}Ga_{0.85}As$ layer and the carrier concentration of the $Al_{0.9}Ga_{0.1}As$ layer is about $4 \times 10^{18}$ cm$^{-3}$, and the overall film thickness of the upper DBR 26 is about 3 µm. For example, C (carbon) is used as the p-type carrier. An AlAs layer, which serves to form the oxide confinement layer 32 during a process to be described below, is included in the upper DBR 26.

The p-type contact layer 28 is formed by setting the carrier concentration to, for example, about $1 \times 10^{19}$ cm$^{-3}$ or more and the film thickness to, for example, about 10 nm.

Figure 6B:
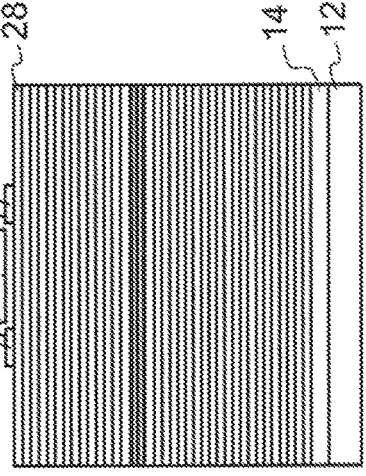

Next, an electrode material is deposited on the contact layer 28 of the wafer of which the epitaxial growth is completed, and then the material is dry-etched using a mask formed by, for example, photolithography, so that a contact metal CMp for taking out the p-side electrode wiring 36 is formed as illustrated in FIG. 6B. For example, the contact metal CMp is formed by using a stacked film of Ti/Au.

Next, a material, which becomes an emission surface protective layer, is deposited on the surface of the wafer, and then the material is dry-etched using a mask formed by, for example, photolithography, so that the emission surface protective layer 38 is formed as illustrated in FIG. 6B. For example, a silicon nitride film is used as a material of the emission surface protective layer 38.

Figure 6C:
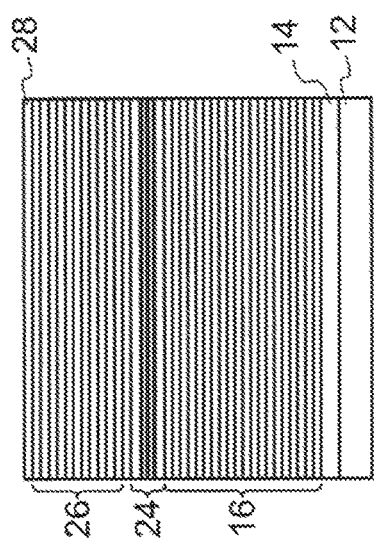

Next, a mask is formed by photolithography, and then H$^+$ ions and the like are implanted through the emission surface protective layer 38, so that the current blocking region 60 is formed as illustrated in FIG. 6C.

Figure 6D:
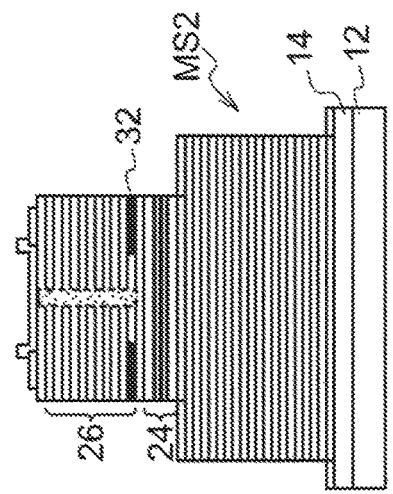

Next, a mask is formed on the surface of the wafer by photolithography and etching, and dry etching is performed by using the mask, so that a mesa MS1 is formed as illustrated in FIG. 6D. When forming the mesa MS1, etching is performed so that a mesa M having layers corresponding to the mesas M1 and M2 illustrated in FIG. 1B in a top plan view is formed.

Figure 6E:
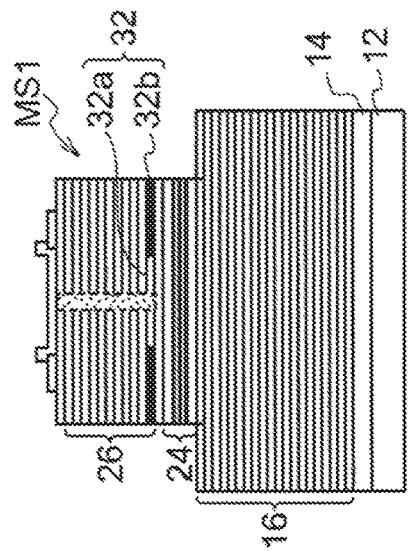

Next, an oxidation treatment is performed on the wafer, and thus the AlAs layer is oxidized from a lateral surface thereof, so that the oxide confinement layer 32 is formed in the mesa MS1 as illustrated in FIG. 6E. The oxide confinement layer 32 includes a non-oxidized region 32a and an oxidized region 32b. The oxidized region 32b is a region which is oxidized by the oxidation treatment, and the non-oxidized region 32a is the remaining region which is not oxidized. As illustrated in FIG. 1B, the non-oxidized region 32a is formed continuously from the mesa M1 to the mesa M2.

Figure 6F:
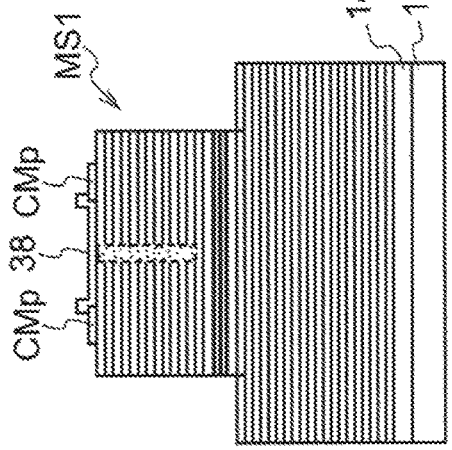

Next, a mask is formed on the surface of the wafer by photolithography and etching, and dry etching is performed by using the mask, so that a mesa MS2 is formed as illustrated in FIG. 6F.

Figure 7A:
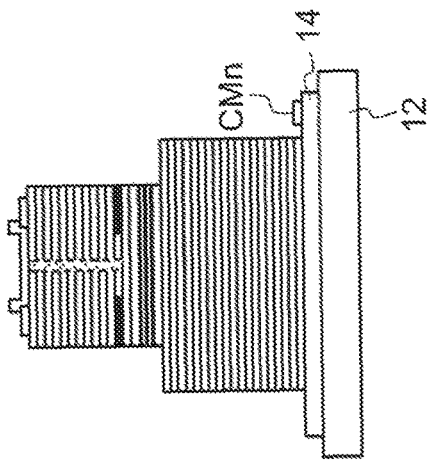
FIGS. 7A to 7D are a part of cross-sectional views illustrating an exemplary method of manufacturing the light emitting element according to the exemplary embodiment.

Next, a mask is formed on the surface of the wafer by photolithography and etching, and dry etching is performed by using the mask, so that a mesa MS3 is formed as illustrated in FIG. 7A.

Figure 7B:
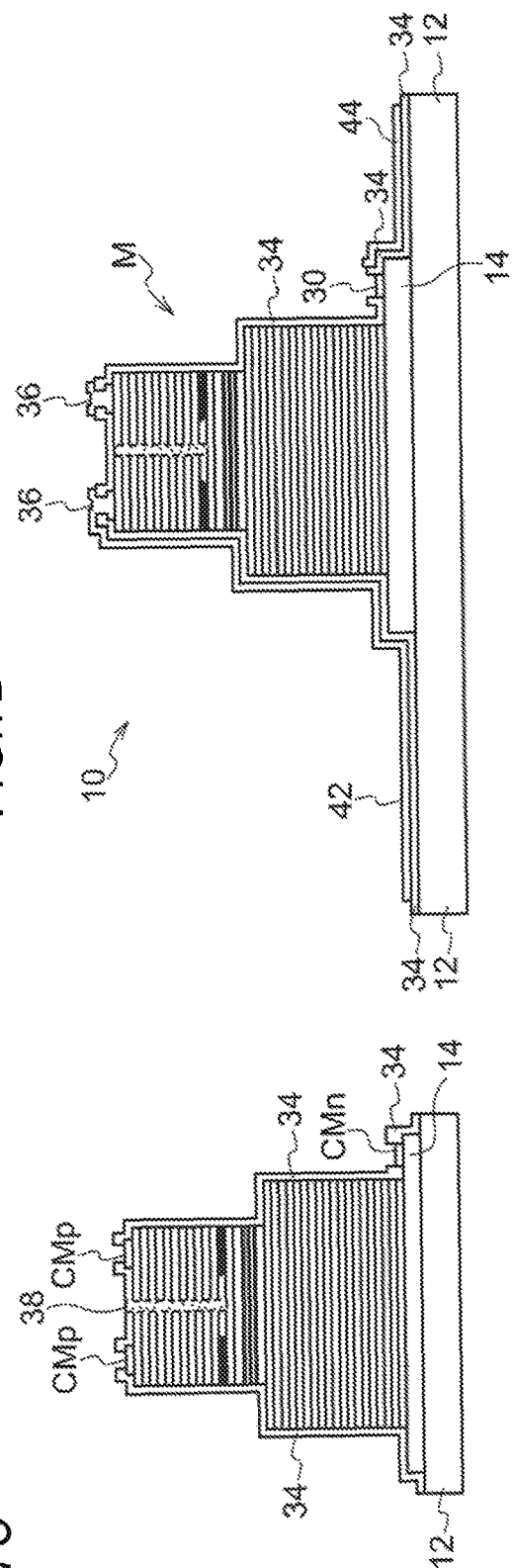

An electrode material is deposited on the contact layer 14, and then the material is dry-etched using a mask formed by, for example, photolithography, so that a contact metal CMn for extracting the n-side electrode wiring 30 is formed as illustrated in FIG. 7B. For example, the contact metal CMn is formed by using a stacked film of AuGe/Ni/Au.

Figure 7C:
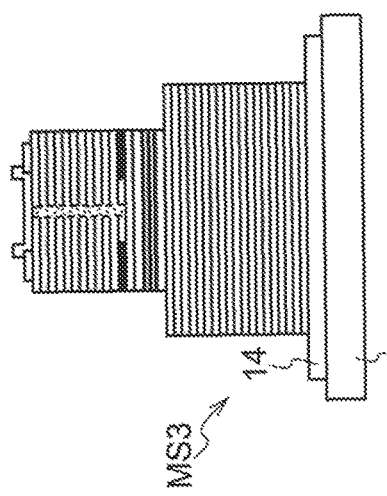

Next, as illustrated in FIG. 7C, the interlayer insulating film 34 configured with a silicon nitride film is formed in a region except for the emission surface protective layer 38 and the contact metal CMp and CMn of the wafer.

Figure 7D:
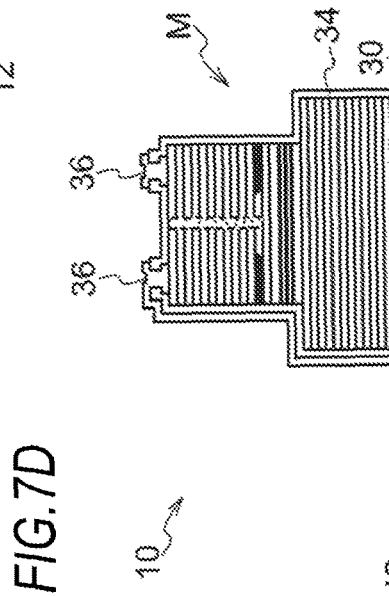

Next, an electrode material is deposited on the surface of the wafer, and then the electrode material is dry-etched using a mask formed by, for example, photolithography, so that the p-side electrode wiring 36, the p-side electrode pad 42, the n-side electrode wiring 30, and the n-side electrode pad 44 are formed as illustrated in FIG. 7D. For example, the p-side electrode wiring 36, the p-side electrode pad 42, the n-side electrode wiring 30, and the n-side electrode pad 44 are formed by using a stacked film of Ti/Au. With the present process, the p-side electrode wiring 36 is connected with the contact metal CMp, and the n-side electrode wiring 30 is connected with the contact metal CMn.

Next, dicing is performed on a dicing region (not illustrated) so that the light emitting element 10 is separated as an individual piece. With the aforementioned processes, the light emitting element 10 including the p-side electrode pad 42 and the n-side electrode pad 44 according to the present exemplary embodiment is manufactured.

[Second Exemplary Embodiment]

A light emitting element 10a according to the present exemplary embodiment will be described with reference to FIG. 8. The light emitting element 10a has a configuration in which the current blocking region 60 of the light emitting element 10 according to the exemplary embodiment is substituted by a current blocking region 60a. Therefore, the constituent elements except for the current blocking region are identical to those of the light emitting element 10. The same constituent elements are designated by the same reference numerals, and detailed descriptions thereof will be omitted.

Figure 8:
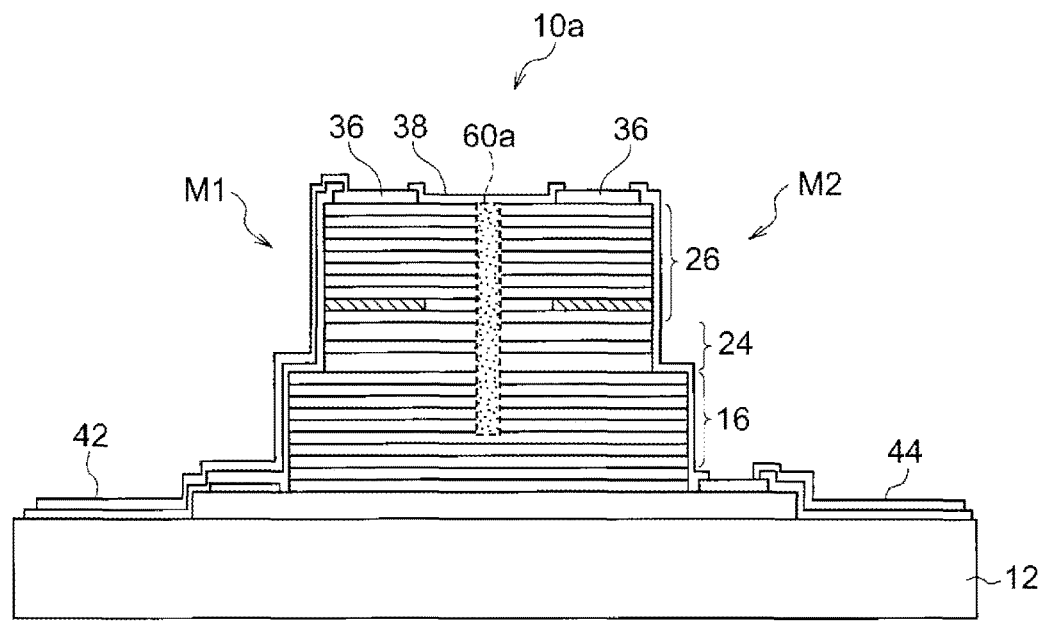
FIG. 8 is a cross-sectional view illustrating an exemplary configuration of alight emitting element according to a second exemplary embodiment.

As illustrated in FIG. 8, the light emitting element 10a has the current blocking region 60a that penetrates the active region 24 and reaches an intermediate portion of the lower DBR 16. Like the current blocking region 60, the current blocking region 60a is formed by implanting ions such as $H^+$ (proton). It is considered that deterioration of the active region is caused when the current blocking region reaches the active region. In this case, like the current blocking region 60, the current blocking region may be formed to a depth that does not reach the active region 24. Meanwhile, in a range where deterioration of the active region 24 is allowed, the current blocking region 60a may be provided to a depth that reaches the intermediate portion of the lower DBR 16 by penetrating the active region 24 like the light emitting element 10a.

According to the light emitting element 10a according to the present exemplary embodiment, the light emitting part 50 and the light receiving part 52 are more reliably electrically separated from each other, compared with the light emitting element 10, and as a result, crosstalk is further reduced when the light emitting part 50 is differentially driven.

[Third Exemplary Embodiment]

A light emitting element 10b according to the present exemplary embodiment will be described with reference to FIG. 9. The light emitting element 10b has a configuration in which the current blocking region 60a of the light emitting element 10a according to the exemplary embodiment is substituted by a current blocking region 60b. Therefore, the constituent elements except for the current blocking region are identical to those of the light emitting element 10a. The same constituent elements are designated by the same reference numerals, and detailed descriptions thereof will be omitted.

Figure 9:
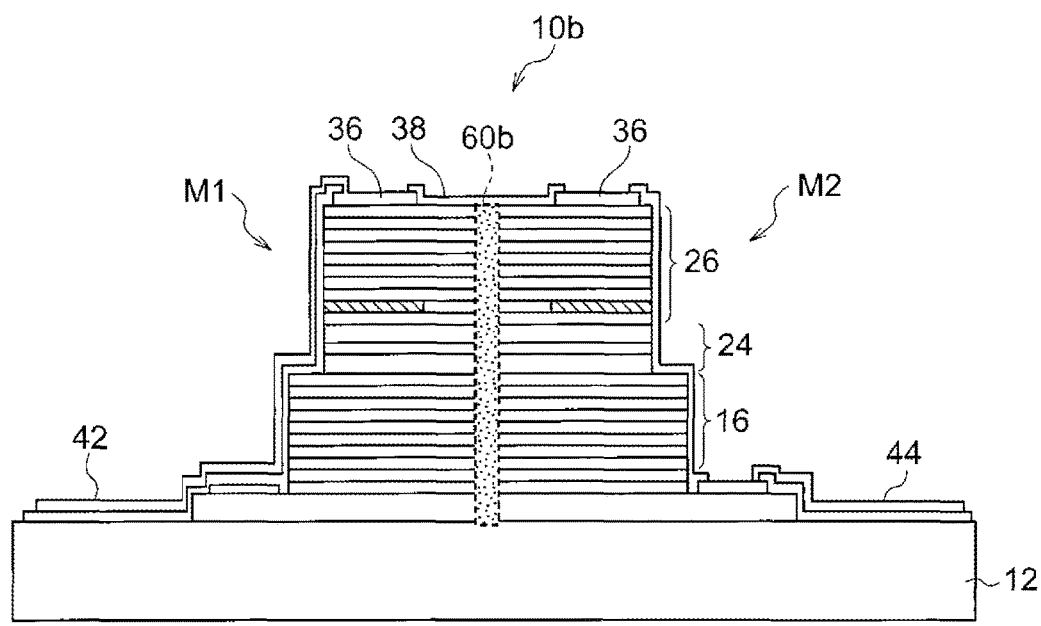
FIG. 9 is a cross-sectional view illustrating an exemplary configuration of alight emitting element according to a third exemplary embodiment.

As illustrated in FIG. 9, the light emitting element 10b has the current blocking region 60b that penetrates the active region 24 and the contact layer 14 and reaches the substrate 12, and the current blocking region 60b is also formed by implanting ions such as $H^+$ (proton) like the current blocking region 60a. In the light emitting element 10a, since the current blocking region 60a is formed up to the intermediate portion of the n-type lower DBR 16, the light emitting part 50 and the light receiving part 52 are not electrically separated from each other. On the contrary, since the current blocking region 60b of the light emitting element 10b reaches the substrate 12, the light emitting part 50 and the light receiving part 52 are electrically separated from each other.

According to the light emitting element 10b according to the present exemplary embodiment, the light emitting part 50 and the light receiving part 52 are more reliably electrically separated from each other, compared with the light emitting element 10a, and as a result, crosstalk is further reduced when the light emitting part 50 is differentially driven.

[Fourth Exemplary Embodiment]

Figure 10:
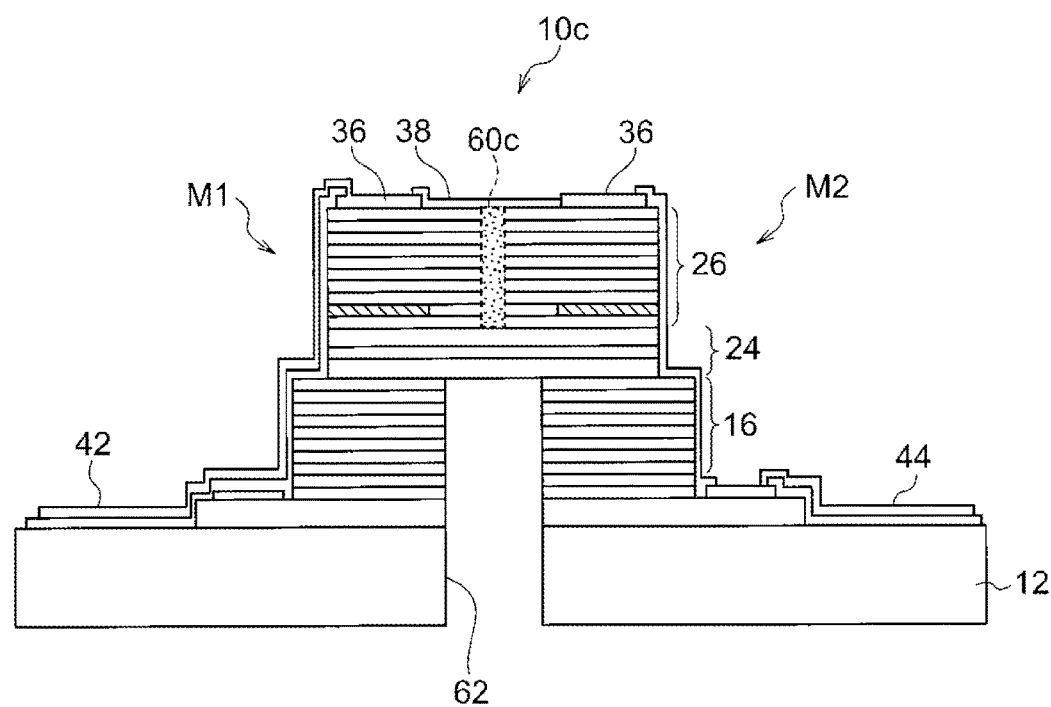
FIG. 10 is a cross-sectional view illustrating an exemplary configuration of alight emitting element according to a fourth exemplary embodiment.

A light emitting element 10c according to the present exemplary embodiment will be described with reference to FIG. 10. The light emitting element 10c has a configuration in which an element separation groove 62 is provided in the back surface of the substrate 12 in addition to the current blocking region 60 of the light emitting element 10 according to the exemplary embodiment. The element separation groove 62 is formed by, for example, etching or the like during a manufacturing process. A current blocking region 60c of the light emitting element 10c is formed in a region from the light emitting surface to an upper side of the active region 24, and has the same configuration as the current blocking region 60 of the light emitting element 10. Therefore, the constituent elements except for the element separation groove 62 are identical to those of the light emitting element 10. The same constituent elements are designated by the same reference numerals, and detailed descriptions thereof will be omitted.

In the light emitting element 10c, the light emitting part 50 and the light receiving part 52 above the active region 24 are electrically separated from each other by the current blocking region 60c, and the light emitting part 50 and the light receiving part 52 below the active region 24 are electrically separated from each other by the element separation groove 62. Since the active region 24 of the light emitting element 10c according to the present exemplary embodiment is not doped as described above, the light emitting part and the light receiving part are electrically separated from each other in the light emitting element 10c.

According to the light emitting element 10c of the present exemplary embodiment, the current blocking region 60c does not reach the active region 24. Thus, the light emitting part 50 and the light receiving part 52 are separated from each other while preventing deterioration of the active region 24, compared with the light emitting element 10b in which the light emitting part 50 and the light receiving part 52 are electrically separated from each other.

[Fifth Exemplary Embodiment]

A light emitting element 10d according to the present exemplary embodiment will be described with reference to FIG. 11. The light emitting element 10d has a configuration in which an element separation groove 64 (recessed portion) is provided in the front surface side of the substrate 12 instead of the current blocking region 60 of the light emitting element 10 according to the exemplary embodiment. The element separation groove 64 is formed by, for example, etching or the like during a manufacturing process. Therefore, the constituent elements except for the element separation groove 64 are identical to those of the light emitting element 10. The same constituent elements are designated by the same reference numerals, and detailed descriptions thereof will be omitted.

The element separation groove 64 of the light emitting element 10d has an effect of the electrical separation like the current blocking region 60 of the light emitting element 10. Therefore, even the element separation groove 64 of the light emitting element 10d partially electrically separates the light emitting part 50 and the light receiving part 52 from each other. In the light emitting element 10d, the light emitting part 50 and the light receiving part 52 are partially separated from each other by the physical groove instead of the current blocking region 60 formed by the ion implantation, and as a result, the portions of the light emitting part 50 and the light receiving part 52 are more reliably electrically separated from each other, compared with the light emitting element 10. In addition, when the element separation groove 64 is provided, an equivalent refractive index of the non-oxidized region 32a is decreased at the region where the element separation groove 64 is provided, and as a result, the semiconductor layer does not always have to be constricted in the coupling portion of the light emitting element 10d according to the present exemplary embodiment.

[Sixth Exemplary Embodiment]

A light emitting element 10e according to the present exemplary embodiment will be described with reference to FIGS. 12A and 12B. In the respective exemplary embodiments, the current blocking regions (current blocking regions 60, and 60a to 60c) or the element separation grooves (element separation grooves 62 and 64) are provided in order to improve the detection precision of an optical output (improve an S/N ratio) by at least partially electrically separating the light emitting part and the light receiving part. However, as described above, the current blocking region or the element separation groove does not always have to be used depending on an acceptable degree for detection precision.

Figure 12A:
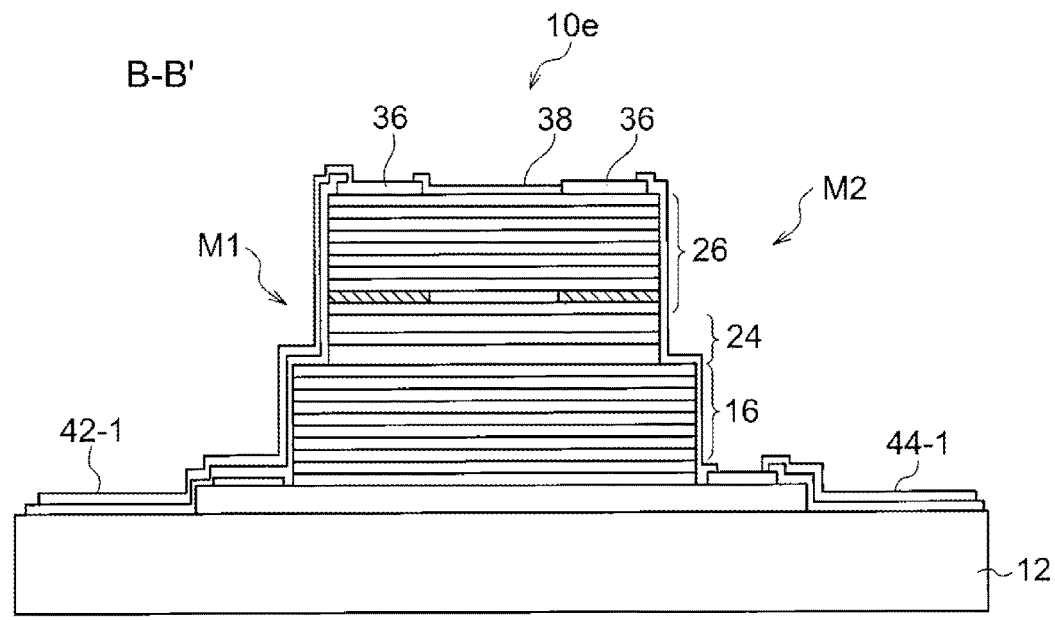
FIGS. 12A and 12B are a cross-sectional view and a top plan view illustrating an exemplary configuration of a light emitting element according to a sixth exemplary embodiment.
Figure 12B:
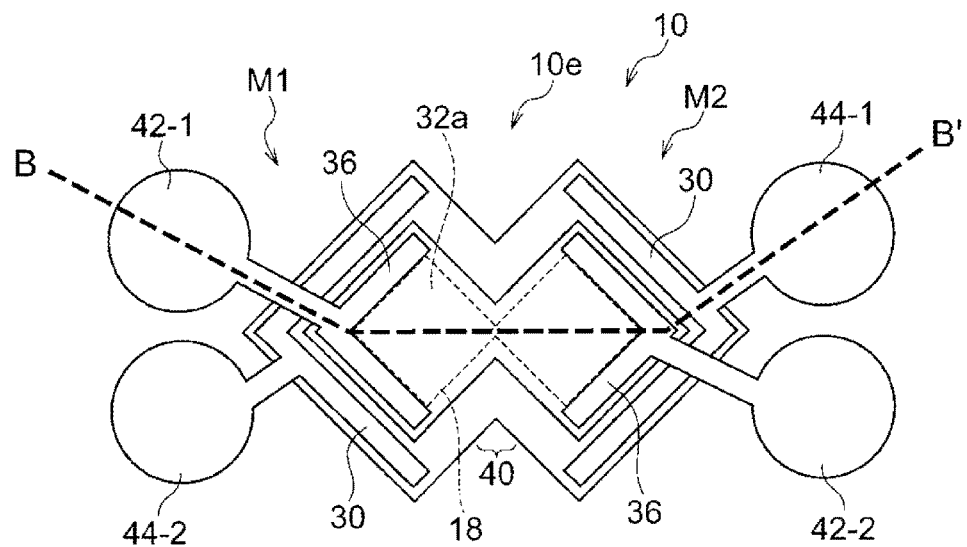

As illustrated in FIGS. 12A and 12B, the light emitting element 10e according to the present exemplary embodiment does not have the current blocking region or the element separation groove. Meanwhile, in the light emitting element 10e, the p-side electrode pad 42-1 and the n-side electrode pad 44-2 are separated from each other in the light emitting part 50, the p-side electrode pad 42-2 and the n-side electrode pad 44-1 are separated from each other in the light receiving part 52, and the pads are disposed on a front surface side of the light emitting element 10e. Therefore, particularly when the light emitting part 50 is differentially driven, crosstalk with the light receiving part 52 is reduced in the light emitting element 10e, compared with the light emitting element 100 (see FIG. 3B) according to the comparative example.

[Seventh Exemplary Embodiment]

Light emitting elements 10f to 10j according to the present exemplary embodiment will be described with reference to FIGS. 13A and 13B to FIG. 15. In the present exemplary embodiment, shapes of the mesas M and shapes of the coupling portions are changed in the first and second exemplary embodiments.

Figure 13A:
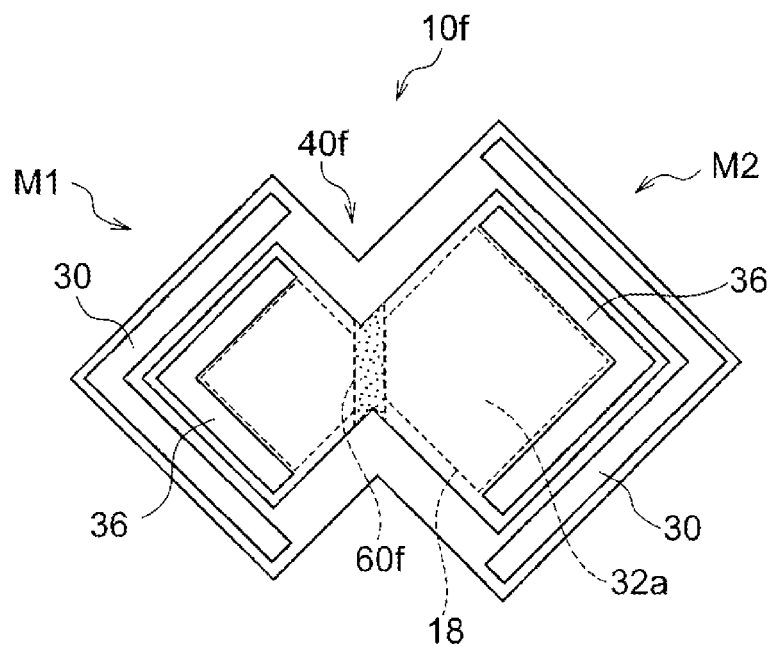
FIGS. 13A and 13B are a part of top plan views illustrating an exemplary configuration of a light emitting element according to a seventh exemplary embodiment.
Figure 13B:
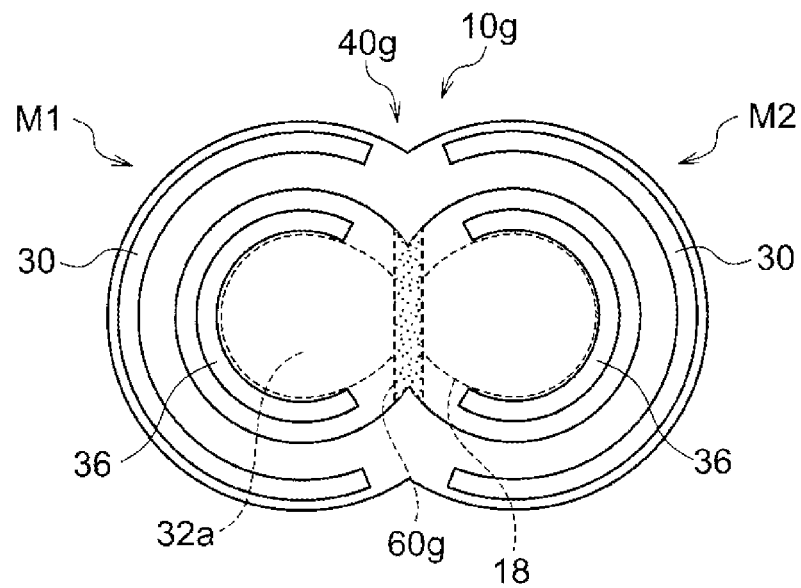

An example in which the mesas M1 and M2 are symmetrical in a top plan view is described in the first and second exemplary embodiments. It should be noted that the present invention is not limited thereto. For example, the mesas M1 and M2 may be asymmetrical to each other like the light emitting element 10f illustrated in FIG. 13A, and in this case, the shape of a coupling portion 40f is also asymmetrical in a top plan view. In that event, as illustrated in FIG. 13A, in a case where the mesa M2 that constitutes the light receiving part is made to be greater than the mesa M1 that constitutes the light emitting part, the efficiency in detecting the monitor current Im is improved.

In addition, in each of the aforementioned exemplary embodiments, descriptions have been made on an aspect in which the mesa M1 and the mesa M2 have a rectangular shape. It should be noted that the invention is not limited thereto. Alternatively, the mesa M1 and the mesa M2 may have a circular shape like the light emitting element 10g illustrated in FIG. 13B. Since the light emitting elements 10f and 10g are provided with coupling portions 40f and 40g having constricted portions, respectively, the light emitting elements 10f and 10g may only have current blocking regions 60f and 60g, respectively. Of course, the light emitting elements 10f and 10g may further have the current blocking region and the element separation groove. The configuration in which the current blocking region and the element separation groove are employed refers to a current blocking region which reaches the lower DBR 16 and is formed by implanting ions such as H$^+$(proton) through the element separation groove 64, for example, in a state where the element separation groove 64 is formed to the upper side of the active region 24 as illustrated in FIG. 11.

Figure 11:
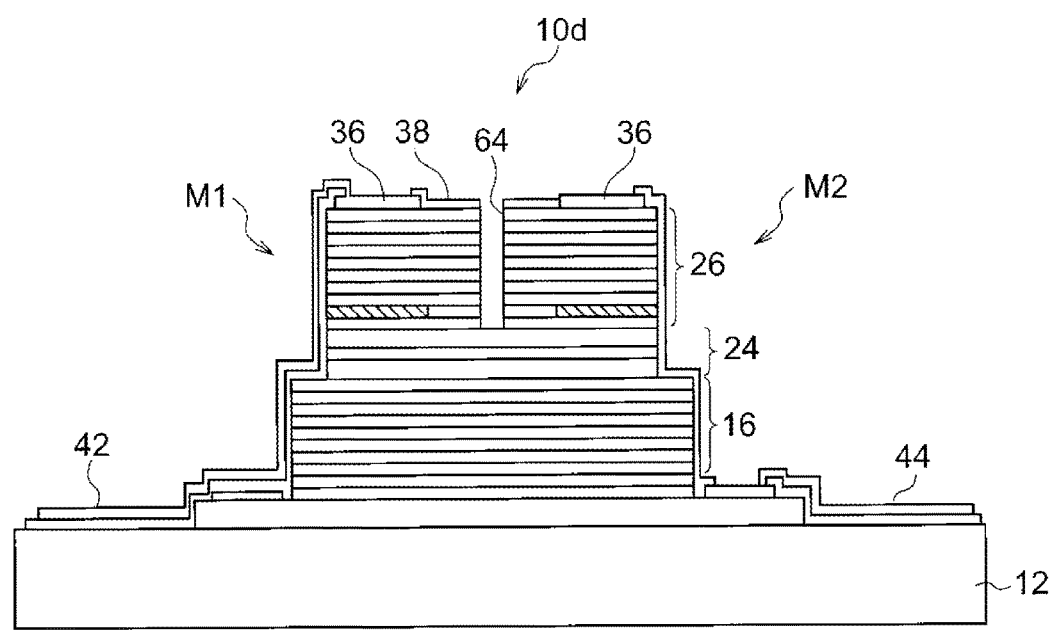
FIG. 11 is a cross-sectional view illustrating an exemplary configuration of alight emitting element according to a fifth exemplary embodiment.
Figure 14A:
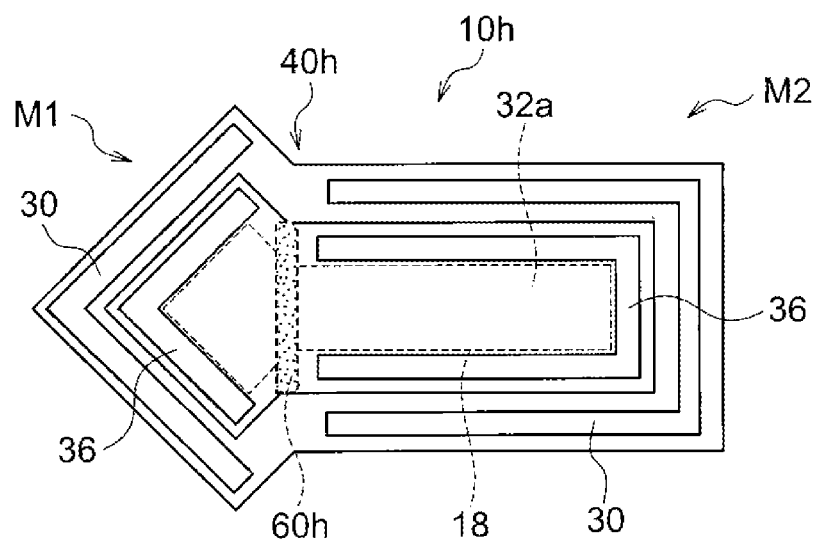
FIGS. 14A and 14B are a part of top plan views illustrating an exemplary configuration of the light emitting element according to the seventh exemplary embodiment.
Figure 14B:
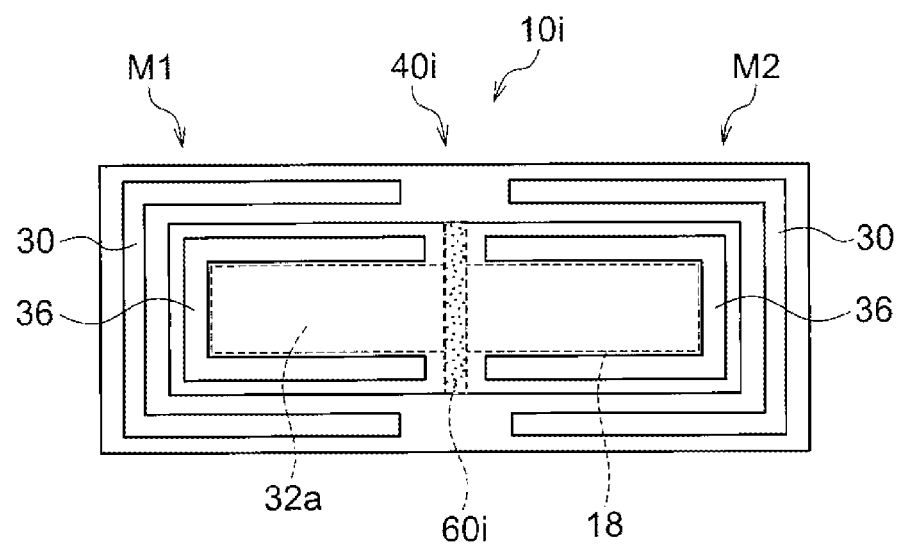
Figure 15:
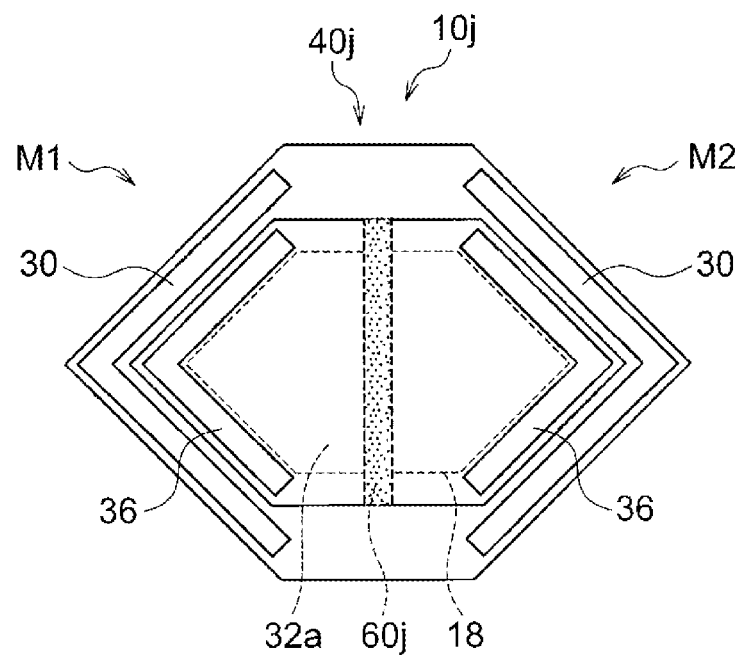
FIG. 15 is a part of a top plan view illustrating an exemplary configuration of the light emitting element according to the seventh exemplary embodiment.

FIGS. 14A, 14B, and 15 illustrate configurations in which a current blocking region and an element separation groove are employed as described above, and an element separation groove, which is identical to the element separation groove illustrated in FIG. 11, is provided at a position of the coupling portion. As described above, in a case where the element separation groove is provided, an equivalent refractive index of the non-oxidized region 32a at a position of the element separation groove is decreased, and as a result, it does not always have to provide a constricted portion in the semiconductor layer.

FIG. 14A illustrates a configuration of the light emitting element 10h in which the mesa M1 having a substantially square shape and the mesa M2 having a substantially rectangular shape are connected, and no constricted portion is provided in the coupling portion 40h. In the light emitting element 10h, an equivalent refractive index of the non-oxidized region 32a of the mesa M2 has a constant value lower than that of an equivalent refractive index of the non-oxidized region 32a of the mesa M1. However, with an element separation groove (not illustrated) disposed at a position of a current blocking region 60h, an equivalent refractive index at the position of the current blocking region 60h has a value lower than that of an equivalent refractive index of the mesa M2. For this reason, a region, which has an equivalent refractive index lower than that of the mesa M2, is present between the mesa M1 and the mesa M2. Therefore, even in the light emitting element 10h, the light emitted from the light emitting part is efficiently confined in the non-oxidized region 32a, and the light (slow light) from the light emitting part leaks and is received by the light receiving part 52.

FIG. 14B illustrates a configuration of the light emitting element 10i in which the mesa M1 and the mesa M2 are formed such that the overall shape of the mesa M is a single rectangular shape, and no constricted portion is provided in a coupling portion 40i. Therefore, an equivalent refractive index of the non-oxidized region 32a is constant from the mesa M1 to the mesa M2. However, with an element separation groove disposed at a position of a current blocking region 60i, an equivalent refractive index at the position of the current blocking region 60i has a value lower than those of equivalent refractive indexes of the mesas M1 and M2. For this reason, a region, which has an equivalent refractive index lower than those of the mesas M1 and M2, is present between the mesa M1 and the mesa M2. Therefore, even in the light emitting element 10i, the light emitted from the light emitting part is efficiently confined in the non-oxidized region 32a, and the light (slow light) leaks from the light emitting part to be received by the light receiving part 52.

FIG. 15 illustrates a configuration of the light emitting element 10j in which the mesa M1 and the mesa M2 are formed such that the overall shape of the mesa M is a single hexagonal shape, and no constricted portion is provided in a coupling portion 40j. Therefore, an equivalent refractive index of the non-oxidized region 32a is constant from the mesa M1 to the mesa M2. However, with an element separation groove disposed at a position of a current blocking region 60j, an equivalent refractive index at the position of the current blocking region 60j has a value lower than that of equivalent refractive indexes of the mesas M1 and M2. For this reason, a region, which has an equivalent refractive index lower than those of the mesas M1 and M2, is present between the mesa M1 and the mesa M2. Therefore, even in the light emitting element 10j, the light emitted from the light emitting part is efficiently confined in the non-oxidized region 32a, and the light (slow light) leaks from the light emitting part to be received by the light receiving part 52.

In addition, in each of the aforementioned exemplary embodiments, descriptions have been made while exemplifying an aspect in which the APC controller 54 and the light emitting element 10 are configured as separate components. It should be noted that the present invention is not limited thereto. For example, the light emitting element 10 and the APC controller 54 maybe configured as a single chip by integrating the light emitting element 10 and the APC controller 54 by using the same semiconductor process. Further, only the current-voltage conversion unit of the APC controller 54 may be integrated with the light emitting element. In this case, for example, a resistance for detecting a monitor current, or a circuit in which a resistance and a current mirror are combined may be integrated with the light emitting element.

In addition, in the aforementioned exemplary embodiments, descriptions have been made while exemplifying a GaAs-based light emitting element using a semi-insulating GaAs substrate. It should be noted that the invention is not limited thereto. Alternatively, a GaN (gallium nitride) substrate or an InP (indium phosphide) substrate may also be used.

Further, in the aforementioned exemplary embodiments, descriptions have been made while exemplifying an aspect in which the n-type contact layer is formed on the substrate. It should be noted that the invention is not limited thereto. Alternatively, a p-type contact layer may be formed on the substrate. In this case, in the aforementioned description, the n-type and the p-type may be reversely read.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A light emitting element comprising:
   a semi-insulating substrate;
   a light emitting part that is formed on a front surface side of the semi-insulating substrate; and
   a light receiving part that is formed on the front surface side, that shares a semiconductor layer with the light emitting part, that receives light propagating in a lateral direction through the semiconductor layer from the light emitting part, and that is configured to output current corresponding to the received light,
   a first anode electrode pad connected to the light emitting part,
   a first cathode electrode pad connected to the light emitting part,
   a second anode electrode pad connected to the light receiving part, and
   a second cathode electrode pad connected to the light receiving part,
   wherein the first anode electrode pad, the first cathode electrode pad, the second anode electrode pad, and the second cathode electrode pad are separated from each other and are formed on the front surface side of the semi-insulating substrate.

2. The light emitting element according to claim 1, wherein
   the light emitting part and the light receiving part share a quantum layer, and
   a current blocking region is formed between the light emitting part and the light receiving part from the front surface side to a depth that does not reach the quantum layer.

3. The light emitting element according to claim 1, wherein
   the light emitting part and the light receiving part share a quantum layer, and
   a current blocking region is formed between the light emitting part and the light receiving part from the front surface side to a depth that exceeds the quantum layer.

4. The light emitting element according to claim 1, wherein
   the light emitting part and the light receiving part share a quantum layer, and
   a current blocking region is formed between the light emitting part and the light receiving part from the front surface side to a depth that reaches the semi-insulating substrate.

5. The light emitting element according to claim 2, wherein
   the current blocking region is formed with at least one of
   (i) an ion implantation region formed by implanting predetermined ions into the semiconductor layer and
   (ii) a recess portion provided in the semiconductor layer.

6. The light emitting element according to claim 3, wherein
   the current blocking region is formed with at least one of
   (i) an ion implantation region formed by implanting predetermined ions into the semiconductor layer and
   (ii) a recess portion provided in the semiconductor layer.

7. The light emitting element according to claim 4, wherein
   the current blocking region is formed with at least one of
   (i) an ion implantation region formed by implanting predetermined ions into the semiconductor layer and
   (ii) a recess portion provided in the semiconductor layer.

8. The light emitting element according to claim 1, wherein
   the light emitting part and the light receiving part share a quantum layer, and
   a groove is formed between the light emitting part and the light receiving part from a back surface side of the semi-insulating substrate to a depth that exceeds a thickness of the semi-insulating substrate and does not exceed the quantum layer.

9. The light emitting element according to claim 2, wherein
the light emitting part and the light receiving part share a quantum layer, and
a groove is formed between the light emitting part and the light receiving part from a back surface side of the semi-insulating substrate to a depth that exceeds a thickness of the semi-insulating substrate and does not exceed the quantum layer.

10. The light emitting element according to claim 3, wherein
the light emitting part and the light receiving part share a quantum layer, and
a groove is formed between the light emitting part and the light receiving part from a back surface side of the semi-insulating substrate to a depth that exceeds a thickness of the semi-insulating substrate and does not exceed the quantum layer.

11. The light emitting element according to claim 4, wherein
the light emitting part and the light receiving part share a quantum layer, and
a groove is formed between the light emitting part and the light receiving part from a back surface side of the semi-insulating substrate to a depth that exceeds a thickness of the semi-insulating substrate and does not exceed the quantum layer.

12. The light emitting element according to claim 5, wherein
the light emitting part and the light receiving part share a quantum layer, and
a groove is formed between the light emitting part and the light receiving part from a back surface side of the semi-insulating substrate to a depth that exceeds a thickness of the semi-insulating substrate and does not exceed the quantum layer.

13. The light emitting element according to claim 1, wherein the light emitting part and the light receiving part are at least partially electrically separated from each other.

14. The light emitting element according to claim 1, further comprising:
a voltage conversion unit that is connected to the light receiving part and that converts a current, which is generated by the light received by the light receiving part, into a voltage.

15. The light emitting element according to claim 1, wherein
the first anode electrode pad connected to the light emitting part, the first cathode electrode pad connected to the light emitting part, the second anode electrode pad connected to the light receiving part, and the second cathode electrode pad connected to the light receiving part are formed, via an insulating film on a front surface of the semi-insulating substrate.

16. The light emitting element according to claim 15, further comprising
a first p-side electrode formed on the light emitting part, and
a second p-side electrode formed on the light receiving part,
wherein the first p-side electrode is connected to the first anode electrode pad, and the second p-side electrode is connected to the second anode electrode pad.

17. The light emitting element according to claim 1, further comprising
a first p-side electrode formed on the light emitting part, and
a second p-side electrode formed on the light receiving part,
wherein the first p-side electrode is connected to the first anode electrode pad, and the second p-side electrode is connected to the second anode electrode pad.

18. The light emitting element according to claim 17, wherein
the first p-side electrode is formed on a top of the light emitting part, and
the second p-side electrode is formed on a top of the light receiving part.

19. The light emitting element according to claim 18, wherein
the first anode electrode pad is formed on a bottom side of the light emitting part, and
the second anode electrode pad is formed on a bottom side of the light receiving part.

20. The light emitting element according to claim 17, wherein
the first p-side electrode is connected to the first anode electrode pad via a wiring formed on a side surface of the light emitting part, and
the second p-side electrode is connected to the second anode electrode pad via a wiring formed on a side surface of the light receiving part.

* * * * *